(12) United States Patent
Miao et al.

(10) Patent No.: US 11,637,041 B2
(45) Date of Patent: Apr. 25, 2023

(54) METHOD OF FORMING HIGH MOBILITY COMPLEMENTARY METAL-OXIDE-SEMICONDUCTOR (CMOS) DEVICES WITH FINS ON INSULATOR

(71) Applicant: International Business Machines Corporation, Armonk, NY (US)

(72) Inventors: Xin Miao, Guilderland, NY (US); Chen Zhang, Albany, NY (US); Kangguo Cheng, Schenectady, NY (US); Wenyu Xu, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 216 days.

(21) Appl. No.: 17/131,929

(22) Filed: Dec. 23, 2020

(65) Prior Publication Data
US 2021/0111195 A1 Apr. 15, 2021

Related U.S. Application Data

(63) Continuation of application No. 16/106,957, filed on Aug. 21, 2018, now Pat. No. 10,971,522.

(51) Int. Cl.
*H01L 21/8238* (2006.01)
*H01L 21/02* (2006.01)
(Continued)

(52) U.S. Cl.
CPC ............... *H01L 21/823821* (2013.01); *H01L 21/02381* (2013.01); *H01L 21/02422* (2013.01);
(Continued)

(58) Field of Classification Search
CPC ......... H01L 21/02381; H01L 21/02422; H01L 21/02428; H01L 21/02647; H01L 21/823807; H01L 21/823821
See application file for complete search history.

(56) References Cited

U.S. PATENT DOCUMENTS 9,293,530 B1 * 3/2016 Cheng ............. H01L 21/823431
9,484,439 B1 11/2016 Cheng et al.
(Continued)

OTHER PUBLICATIONS

Office Action for U.S. Appl. No. 16/106,957 dated Aug. 28, 2019, 32 pages.
(Continued)

*Primary Examiner* — Michael Jung
(74) *Attorney, Agent, or Firm* — Amin, Turocy & Watson, LLP

(57) ABSTRACT

The subject disclosure relates to high mobility complementary metal-oxide-semiconductor (CMOS) devices and techniques for forming the CMOS devices with fins formed directly on the insulator. According to an embodiment, a method for forming such a high mobility CMOS device can comprise forming, via a first epitaxial growth of a first material, first pillars within first trenches formed within a dielectric layer, wherein the dielectric layer is formed on a silicon substrate, and wherein the first pillars comprise first portions with defects and second portions without the defects. The method can further comprise forming second trenches within a first region of the dielectric layer, and further forming second pillars within the second trenches via a second epitaxial growth of one or more second materials using the second portions of the first pillars as seeds for the second epitaxial growth.

9 Claims, 16 Drawing Sheets

(51) Int. Cl.
  *H01L 27/12* (2006.01)
  *H01L 29/10* (2006.01)
  *H01L 29/78* (2006.01)
  *H01L 29/161* (2006.01)
  *H01L 29/20* (2006.01)
  *H01L 29/66* (2006.01)
  *H01L 29/737* (2006.01)
  *H01L 29/786* (2006.01)

(52) U.S. Cl.
  CPC .. *H01L 21/02428* (2013.01); *H01L 21/02647* (2013.01); *H01L 21/823807* (2013.01); *H01L 27/1211* (2013.01); *H01L 29/1054* (2013.01); *H01L 29/161* (2013.01); *H01L 29/20* (2013.01); *H01L 29/66795* (2013.01); *H01L 29/7378* (2013.01); *H01L 29/785* (2013.01); *H01L 29/786* (2013.01)

(56) References Cited

U.S. PATENT DOCUMENTS

| | | |
|---|---|---|
| 9,515,073 B1 | 12/2016 | Jagannathan et al. |
| 9,548,319 B2 | 1/2017 | Jagannathan et al. |
| 9,564,373 B2 | 2/2017 | Cheng et al. |
| 9,633,908 B2 | 4/2017 | Cheng et al. |
| 9,698,046 B2 | 7/2017 | Basu et al. |
| 9,859,381 B2 | 1/2018 | Li et al. |
| 9,911,739 B2 | 3/2018 | Cheng et al. |
| 9,947,793 B1 | 4/2018 | Xie et al. |
| 9,953,884 B2 | 4/2018 | Balakrishnan et al. |
| 2012/0228672 A1 | 9/2012 | Daval et al. |
| 2015/0318176 A1 | 11/2015 | Qi et al. |
| 2016/0268310 A1 | 9/2016 | Jagannathan et al. |
| 2016/0380104 A1* | 12/2016 | Cohen ............... H01L 29/1033 438/283 |
| 2017/0110333 A1* | 4/2017 | Beveridge ......... H01L 21/30625 |
| 2017/0207136 A1 | 7/2017 | Kerber et al. |
| 2017/0236821 A1 | 8/2017 | Kim et al. |
| 2019/0067116 A1 | 2/2019 | Fan et al. |

OTHER PUBLICATIONS

Office Action for U.S. Appl. No. 16/106,957 dated Jan. 7, 2020, 32 pages.
Office Action for U.S. Appl. No. 16/106,957 dated Jul. 1, 2020, 20 pages.

* cited by examiner

METHOD OF FORMING HIGH MOBILITY COMPLEMENTARY METAL-OXIDE-SEMICONDUCTOR (CMOS) DEVICES WITH FINS ON INSULATOR

TECHNICAL FIELD

This disclosure relates to complementary metal-oxide-semiconductor (CMOS) devices, and more particularly to high mobility CMOS devices with fins formed directly on the insulator.

SUMMARY

The following presents a summary to provide a basic understanding of one or more embodiments of the invention. This summary is not intended to identify key or critical elements or delineate any scope of the different embodiments or any scope of the claims. Its sole purpose is to present concepts in a simplified form as a prelude to the more detailed description that is presented later. The subject disclosure relates to high mobility complementary metal-oxide-semiconductor (CMOS) devices and techniques for forming the CMOS devices with fins formed directly on the insulator.

According to an embodiment, a method for forming such a high mobility CMOS device can comprise forming, via a first epitaxial growth of a first material, first pillars within first trenches formed within a dielectric layer, wherein the dielectric layer is formed on a silicon substrate, and wherein the first pillars comprise first portions with defects and second portions without the defects. The method can further comprise forming second trenches within a first region of the dielectric layer, and further forming second pillars within the second trenches via a second epitaxial growth of one or more second materials using the second portions of the first pillars as seeds for the second epitaxial growth. In accordance with the subject method, the first material and the one or more second materials are lattice matched. In this regard, the first material and the one or more second materials can be characterized as lattice matched based on having same or similar lattice constants within a defined degree of similarity. In addition, the first material and the silicon substrate are characterized as lattice mismatched based on having different lattice constants that differ beyond the defined degree of similarity.

In one or more implementations, forming the first pillars comprises employing high-aspect ratio trapping (ART) to form the first portions with the defects and the second portions without the defects. In addition, first portions of the first pillars can be formed within a second region of the dielectric layer and wherein the second trenches extend within the first region of dielectric layer to a depth that ends at the second region of the dielectric layer. The method can further comprise, removing the first pillars from the first trenches after the forming the second pillars, and filling the first trenches with a dielectric material, thereby isolating the second pillars from one another.

The CMOS device formed in accordance with the subject method can be considered a high mobility device, because the one or more second materials used to for the second pillars can be high carrier mobility materials (e.g., having a higher carrier mobility than silicon). For example, in one or more implementations, the one or more second materials can be selected from a group consisting of silicon germanium (SiGe), germanium (Ge), semiconductor III-V materials, and semiconductor II-VI materials. The second pillars can serve as the active layer in a transistor formed using the CMOS device, thus facilitating generating of a high mobility CMOS transistor. In some implementations, the one or more second materials can comprise at least two different materials. With these implementations, the resulting second pillars can include different subsets of pillars formed with different materials. For example, some of the second pillars can comprise a high mobility electron carrier material and others can comprise a high mobility hole carrier material. Accordingly, the resulting CMOS device can be used to generate both an n-channel field effect transistor (nFET) and p-channel field effect transistor (pFET) on the same substrate. In various implementations, the second pillars can also have a same height, and the first trenches and the second trenches can be orthogonal to one another.

In another embodiment, a transistor structure is provided. The transistor structure can comprise an insulator layer formed on a silicon substrate, and channel fins formed on the insulator layer and comprising an active layer material with a higher carrier mobility than silicon, wherein the channel fins are physically isolated from one another. The active layer material of the channel fins can be selected from a group consisting of SiGe, Ge, semiconductor III-V materials, and semiconductor II-VI materials. In some implementations, the insulator layer comprises oxide. The channels fins are formed adjacent to or directly on the insulator layer as a result of epitaxially growth on the insulator layer. However, unlike channel fins or pillars formed using ART, the subject channel fins have a crystal structure without epitaxial defects.

In one or more additional embodiments, another transistor structure is provided that comprises an insulator layer formed on a silicon substrate. The transistor structure can further comprise first channel fins formed on the insulator layer and comprising a first material, and second channel fins formed on the insulator layer and comprising a second material, wherein the first material and the second material have a higher carrier mobility than silicon. For example, the first material and the second material can be selected from a group consisting of silicon germanium (SiGe), germanium (Ge), semiconductor III-V materials, and semiconductor II-VI materials. In one implementations, the first material can have a high electron carrier mobility material, and the second material can have a high hole carrier mobility material. In accordance with these embodiments, respective fins of the first channel fins and the second channel fins are physically isolated from one another via a dielectric material. A thickness of the insulator layer or dielectric material between the respective fins can also vary. For example, in one implementation a thickness of portions of the insulator layer formed between the silicon substrate and the first channel fins or the second channel fins varies. The respective fins of the first channel fins and the second channel fins are parallel to one another and have a same height.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout, and in which.

DETAILED DESCRIPTION

Figure 1:
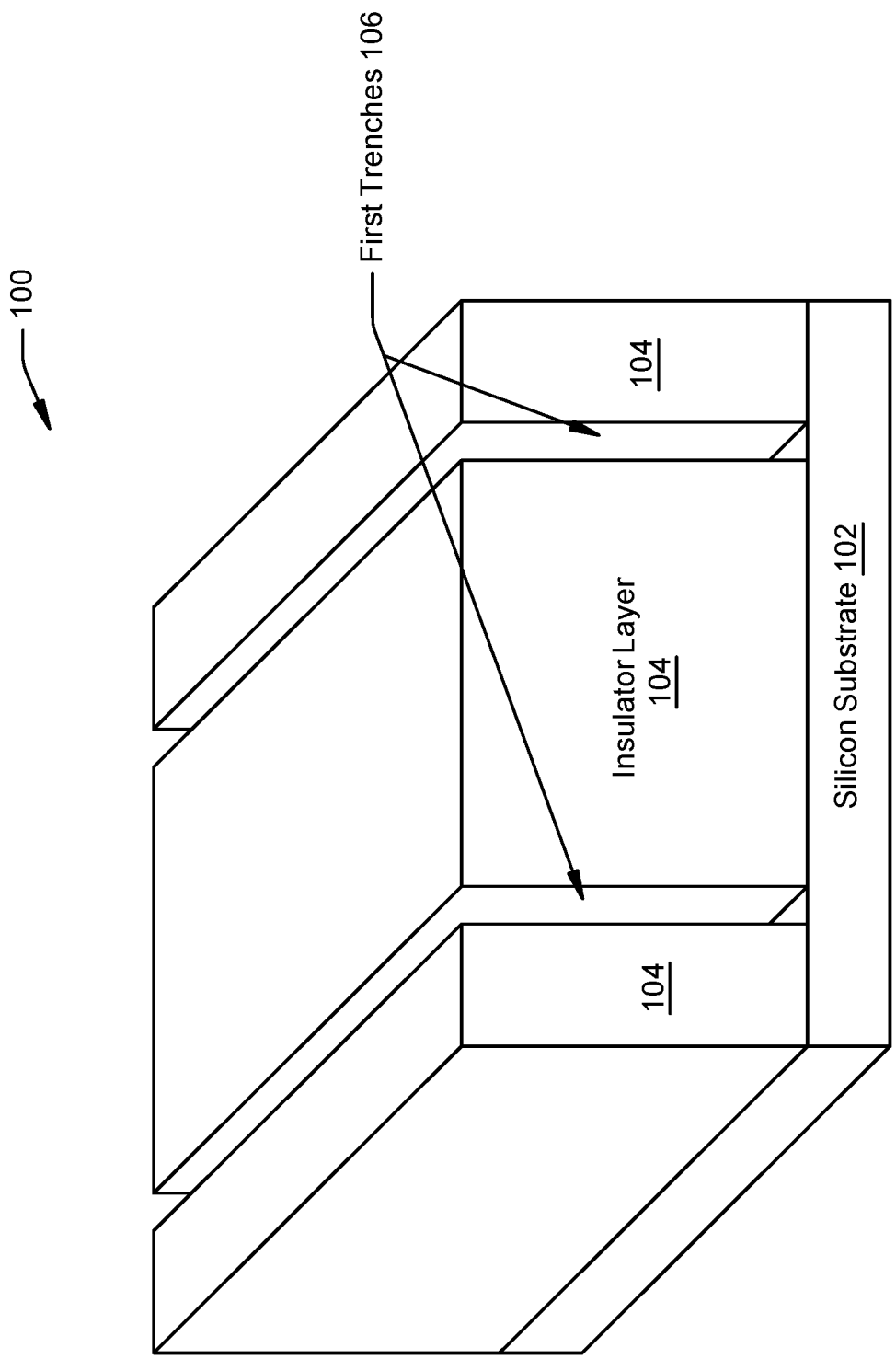
FIG. 1 presents an example intermediate semiconductor structure formed in association with an example fabrication process for forming a high mobility CMOS device with fins formed directly on the insulator layer in accordance with embodiments described herein.

The following detailed description is merely illustrative and is not intended to limit embodiments and/or application or uses of embodiments. Furthermore, there is no intention to be bound by any expressed or implied information presented in the preceding Summary section or in the Detailed Description section.

Transistors with high carrier mobility channels, such as channels with semiconductor III-V and II-VI materials are highly desired for continuing CMOS scaling. Silicon substrates are the foundation of CMOS technology. Therefore, it is highly desired to form high mobility channel transistors on silicon substrates. The subject disclosure provides high mobility CMOS devices or transistors and techniques for forming the high mobility CMOS devices/transistors with channel fins formed directly on the insulator layer, wherein the insulator is formed on a silicon substrate. In one or more embodiments, a method for forming high mobility CMOS devices/transistors is provided that results in channel fins formed out of one or more high mobility materials (e.g., Ge, SiGe, semiconductor III-V and II-VI materials and the like) directly on the insulator layer via epitaxial growth. However, unlike high-aspect ratio trapping (ART) epitaxy process previously employed to grow channel fins of high mobility materials on the silicon substrate, the subject channel fins have a pure crystalline structure with no (or extremely low) epitaxy defects, such as threading, dislocation, misalignment, line defects and the like, and thus do not require isolation processing to minimize carrier leakage attributed to such defects.

In one or more embodiments, the subject techniques employ a two-step epitaxy process to generate the high mobility, defect free channel fins directly on the insulator layer. In the first epitaxy step, a high ART epitaxy process can be performed to vertically grow first pillars within first trenches formed within an insulator layer. The insulator layer can be formed directly on a silicon substrate and the first trenches can extend through the insulator layer to the silicon substrate, thereby exposing the silicon substrate within the base of the first trenches. As a result of the ART epitaxy process, the first pillars will include epitaxially defects in the lower regions of the first pillars that are directly adjacent to the silicon substrate. However, upper portions of the first pillars will be defect-free. The subject techniques employ the defect free upper portions of the first pillars as a growth template for second pillars that can be used as the high mobility channel fins in association with usage of the resulting structure to form high mobility transistors. In particular, after the first pillars are formed, second trenches can be formed within the insulator layer, perpendicular or orthogonal to the first pillars. Unlike the first trenches which extend through the insulator layer to reach the silicon substrate, the second trenches can stop at a depth that is above the lower portions of first pillars including the defects. In this regard, the second trenches can expose sidewalls of only the upper portions of the first pillars. A second epitaxy process can then be employed to laterally grow second pillars within the second trenches using the exposed (defect free, or substantially defect free) sidewalls of the upper portions of the first pillars as a seed.

The material used for the second pillars can comprise a high mobility material (e.g., SiGe, Ge, semiconductor III-V and II-IV materials, and the like) that is lattice matched with the material employed for the first pillars. After the second pillars are formed, the first pillars can be recessed and replaced with an insulator material to further isolate the second pillars in association with usage of the resulting semiconductor structure to form transistors.

As a result of the fabrication process described herein, a semiconductor structure can be formed comprising pillars formed out of one or more high mobility materials and devoid of epitaxy defects. The pillars can further be formed directly on an insulator layer formed on a silicon substrate. The high mobility, defect free pillars of the semiconductor structure are further isolated from one another with insulator material. The resultant semiconductor structure can further be employed to form high mobility transistors, using the high mobility, defect free pillars as the channel fins. Further, because the channel fins have no epitaxial defects, techniques for isolating and/or removing defects from the channel fins in association usage in transistor devices are not required.

One or more embodiments are now described with reference to the drawings, wherein like referenced numerals are used to refer to like elements throughout. It should be appreciated that the various structures depicted in the drawings are merely exemplary and are not drawn to scale. In the following description, for purposes of explanation, numerous specific details are set forth in order to provide a more thorough understanding of the one or more embodiments. It is evident, however, in various cases, that the one or more embodiments can be practiced without these specific details.

It is to be understood that the various layers and/or regions shown in the accompanying drawings are not drawn to scale, and that one or more layers and/or regions of a type commonly used in CMOS transistors, field effect transistors (FETs) and/or other semiconductor devices may not be explicitly shown in a given drawing. This does not imply that the layers and/or regions not explicitly shown are omitted from the actual transistor devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

As used herein, unless otherwise specified, terms such as on, overlying, atop, on top, positioned on, or positioned atop mean that a first element is present on a second element, wherein intervening elements may be present between the first element and the second element. As used herein, unless otherwise specified, the term directly used in connection with the terms on, overlying, atop, on top, positioned, positioned atop, contacting, directly contacting, or the term direct contact, mean that a first element and a second element are connected without any intervening elements, such as, for example, intermediary conducting, insulating or semiconductor layers, present between the first element and the second element. As used herein, terms such as upper, lower, above, below, directly above, directly below, aligned with, adjacent to, right, left, vertical, horizontal, top, bottom, and derivatives thereof shall relate to the disclosed structures as oriented in the drawing figures.

Turning now to the drawings, FIGS. 1-10 respectively present intermediate semiconductor structures formed in association with an example fabrication process for forming a semiconductor structure that can be used to form high mobility CMOS devices/transistors in accordance with embodiments described herein. In this regard, the respective FIGS. 1-10 pictorially demonstrate a sequential flow of respective fabrication steps of the example fabrication process. Repetitive description of like elements shown in respective embodiments is omitted for sake of brevity.

With reference to FIG. 1, presented is an example initial, intermediate semiconductor structure 100 that can be generated in association with the example fabrication process. In the embodiment shown, an insulator layer 104 can be initially formed or deposited on a silicon substrate 102 and patterned or etched to generate two or more first trenches 106 within the insulator layer 104. The first trenches 106 can extend through the entire height of the insulator layer 104 to the silicon substrate 102. In this regard, the base or bottom of the first trenches 106 can reach and expose an upper surface of the silicon substrate 102. The dimensions of the first trenches 106 can be configured to facilitate ART epitaxially growth of pillars therein. In this regard, the first trenches 106 can be relatively narrow and deep so as to be characterized as high aspect ratio trenches. For example, in one or more embodiments, the first trenches 106 can respectively have a width between about 1.0 nm and 50 nm. In another embodiment, the first trenches 106 can respectively have a width between about 2.0 nm and 30 nm. Still in yet another embodiment, the first trenches 106 can respectively have a width between about 5.0 nm and 20 nm. Likewise, in one or more embodiments, the depth of the first trenches 106 can be between about 25 nm and 1.0 micrometer. In another embodiment, the depth of the first trenches 106 can be between about 50 nm and about 800 nm. In another embodiment, the depth of the first trenches 106 can be between about 100 nm and about 500 nm.

The insulator layer 104 can comprise a suitable dielectric material, preferably one having a low dielectric constant k value, such as an oxide. Dielectric materials characterized as low-k dielectrics typically have a k value near or lower than that of silicon dioxide ($SiO_2$), which has a k value of 3.9, while dielectric materials having a k value near or above that of silicon nitride ($SiN_2$), with a k value of 7.0, are considered high-k dielectric materials. In this regard, in one or more embodiments, the insulator layer 104 can be formed with a dielectric material having a k value less than 7.0, more preferably less than 5.0, and even more preferably less than or equal to 3.9. Some suitable dielectric materials that can be used for the insulator layer 104 can include but are not limited to, $SiO_2$, carbon doped silicon oxide (SiOC), silicon oxynitride (SiON) and carbon doped silicon oxynitride (SiOCN).

Figure 2:
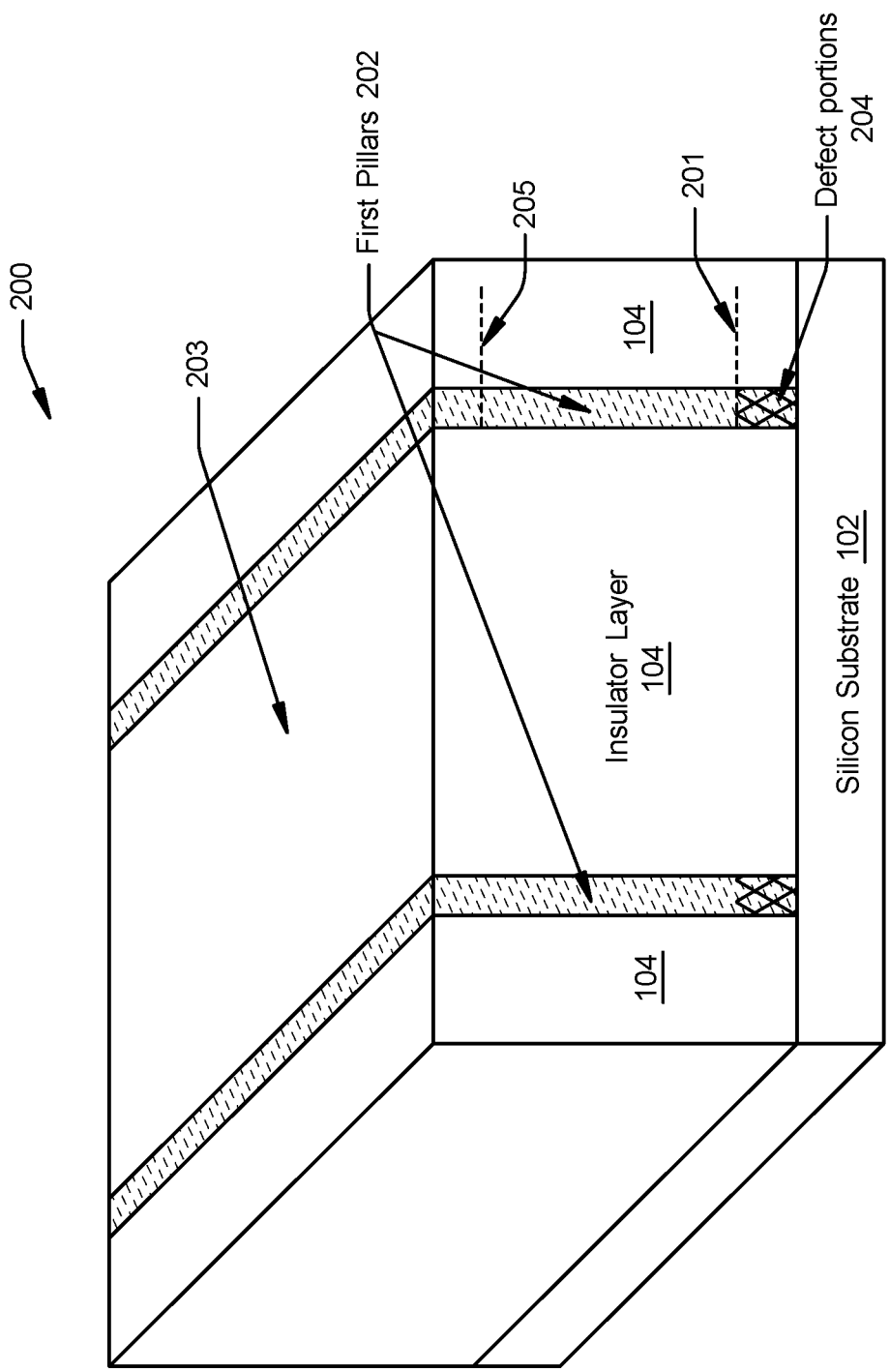
FIG. 2 presents another example intermediate semiconductor structure formed in association with an example fabrication process for forming a high mobility CMOS device with fins formed directly on the insulator layer in accordance with embodiments described herein.

FIG. 2 presents another example intermediate semiconductor structure 200 that can be generated in association with the example fabrication process for forming a semiconductor structure that can be used to form high mobility CMOS devices/transistors, in accordance with embodiments described herein. In the embodiment shown, the first trenches 106 of the intermediate semiconductor structure 100 have been filled with first pillars 202, thereby forming the intermediate semiconductor structure 200.

With reference to FIGS. 1 and 2, in accordance with one or more embodiments, the first pillars 202 can be formed within the first trenches 106 via epitaxial growth, and more particularly via epitaxial growth in accordance with an ART epitaxy or a high ART epitaxy procedure. In accordance with ART or high ART epitaxy, a first pillar material with a lattice constant that is mismatched relative to the lattice constant of silicon of the silicon substrate 102 can be epitaxially grown within the first trenches 106 using the exposed silicon of the silicon substrate 102 as a seed. Due to the lattice mismatch between the first pillar material and the silicon substrate 102, the initial epitaxial growth of the first pillar material will include epitaxial defects, such as threading, dislocation, misalignment, line defects and the like. These epitaxy defects can be trapped in the lower portions of the first trenches 106/first pillars 202. For example, in the embodiment shown in FIG. 2, the epitaxy defects are represented by the crisscrossed diagonal lines at the base of the first pillars 202 below dashed reference line 201. The lower portions of the first pillars 202 comprising the epitaxy defects and are referred to herein as the epitaxy defect portions, or simply, defect portions 204, of the first pillars 202. In accordance with ART or high ART epitaxy, the defect portions 204 of the first pillars relax the strain associated with continued epitaxial growth of the first pillar material vertically within the first trenches 106. As a result, the portions of the first pillars 202 above the defect portions 204 will contain little or no epitaxy defects. In the embodiment shown, the upper or defect free portions of the first pillars 202 comprise the portions of the first pillars 202 above dashed reference line 201. In this regard, the lower or defect portions 204 of the first pillars 202 are located on, adjacent to and contacting the silicon substrate 102, and the upper or defect free portions of the first pillars 202 are located on, adjacent to and contacting the defect portions 204 and extend vertically away from the defect portions 204.

As noted above, the material used to form the first pillars 202 can comprise a material that can be epitaxially grown and that is lattice mismatched with the silicon of the silicon substrate 102. As used herein, the term lattice mismatched refers to a difference in lattice constants between two materials above a first threshold percentage, and the term lattice matched refers to a difference in lattice constants between two materials below a second threshold percentage. For example, in some implementations, the first threshold percentage can be about 0.1 percent. In another example implementation, the first threshold percentage can be about 0.5 percent. Still in yet another implementation, the first threshold percentage can be about 1.0 percent. Similarly, in some implementations, the second threshold percentage can be about 0.1 percent. In another example implementation, the first threshold percentage can be about 0.5 percent. Still in yet another implementation, the first threshold percentage can be about 1.0 percent.

Some suitable materials that can be used to form the first pillars can include one or more of the high mobility materials with a lattice constant that is mismatched with silicon. The terms high mobility and high carrier mobility are used herein interchangeably and refer to materials having a carrier mobility higher than silicon (Si). Some example high mobility materials that can be used for the first pillars 202 can include but not limited to: Ge, SiGe, semiconductor III-V compounds and semiconductor II-VI compounds. Semiconductor III-V compounds comprise compounds formed by combining group III elements with group V elements. Group III elements include boron (B), aluminum (Al), gallium (Ga), indium (In), and thallium (Tl). Group V elements include nitrogen (N), phosphorus (P), arsenic (As), antimony (Sb), and bismuth (Bi). For example, some suitable semiconductor III-V compounds that can be used for the first pillars 202 can include but are not limited to, GaAs, InP, GaP, and GaN. Semiconductor II-VI compounds comprise compounds formed by combining group II elements with group VI elements. Group II elements include, for example, zinc (Zn), Cadmium (Cd) and Mercury (Hg). Group VI elements include, Oxygen (O), Sulphur (S), Selenium (Se), Telluriun (Te) and Polonium (Po). For example, some suitable semiconductor II-VI compounds that can be used for the first pillars 202 can include but are not limited to CdS and CdTe.

The first pillars 202 however are not restricted to high mobility materials. For example, in some embodiments, the first pillars 202 can comprise or otherwise be formed with a low carrier mobility material (e.g., having a carrier mobility near or less than that of silicon), so long as the low carrier mobility material is lattice mismatched with silicon but also has a lattice constant that is matched (e.g., the same as or differs less than a defined threshold) to one or more high carrier mobility materials that can be subsequently used to form the high mobility channel fins, as discussed infra with reference to FIGS. 4A and 4B. For example, some suitable low carrier mobility materials that can be used to form the first pillars can include but are not limited to: GaP, InP, ZnO, ZnS and ZnSe.

In some embodiments, after the first pillars 202 are formed within the first trenches 106, the top surface 203 of the intermediate semiconductor structure 200 can be polished to make the top surface 203 smooth and coplanar. This polishing step can be used for example to remove any excess overgrowth of the first pillars 202 above the top surface of the insulator layer 104.

Figure 3:
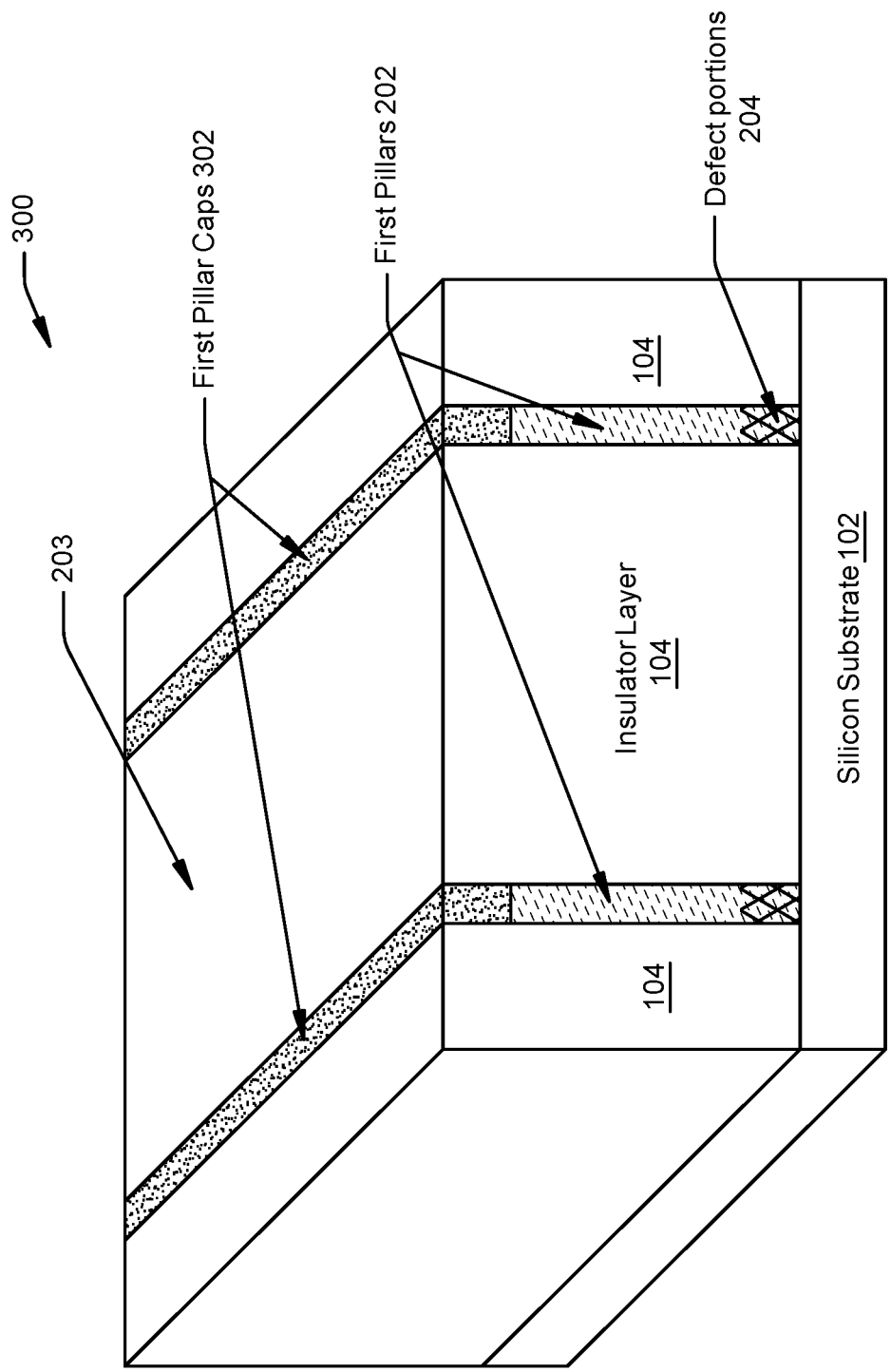
FIG. 3 presents another example intermediate semiconductor structure formed in association with an example fabrication process for forming a high mobility CMOS device with fins formed directly on the insulator layer in accordance with embodiments described herein.

FIG. 3 presents another example intermediate semiconductor structure 300 that can be generated in association with the example fabrication process for forming a semiconductor structure that can be used to form high mobility CMOS devices/transistors, in accordance with embodiments described herein. In the embodiment shown, first pillar caps 302 are formed on and adjacent to the upper portions of the first pillars 202.

With reference to FIGS. 2 and 3, in accordance with one or more embodiments, the first pillar caps 302 can be formed be recessing a small (e.g., 2.0 to 40 nm in depth), top section of the upper or defect free portions of the first pillars 202 of the intermediate semiconductor structure 200 (e.g., using an etchant that is selective to the first pillar material, or another suitable technique), and then depositing a dielectric material within the recess, thereby forming the intermediate semiconductor structure 300. For example, with reference to FIG. 2, the top sections of the first pillars 202 above dashed lined 205 can be removed to form recesses (not shown) within the insulator layer 104 directly above the first pillars 202. The recesses can then be filled with a dielectric material to form the first pillar caps 302. In some embodiments, after the first pillar caps 302 are formed, the top surface 203 of the intermediate semiconductor structure 300 be polished to make the top surface 203 smooth and coplanar.

The first pillar caps 302 can serve to as etchant masks to temporarily protect the first pillars 202 in association with subsequent etching and patterning steps of the fabrication process. Accordingly, the material of the first pillar caps 302 can comprise a dielectric material that facilitates selective etching of other layers of the intermediate semiconductor structure 300 (and subsequent intermediate semiconductor devices described infra) relative to the first pillar caps 302. In this regard, the material employed for the first pillar caps 302 can comprise a dielectric material that has a substantially resistant etch rate for a specific etchant relative to the insulator layer 104 such that the insulator layer 104 can be selectively etched without removing the first pillar caps 302. Thus, the material employed for the first pillar caps 302 depends on the material employed for the insulator layer 104. For example, in one embodiment in which the insulator layer comprises an oxide, the first pillar caps 302 can comprise a nitride, such as SiN.

Figure 4A:
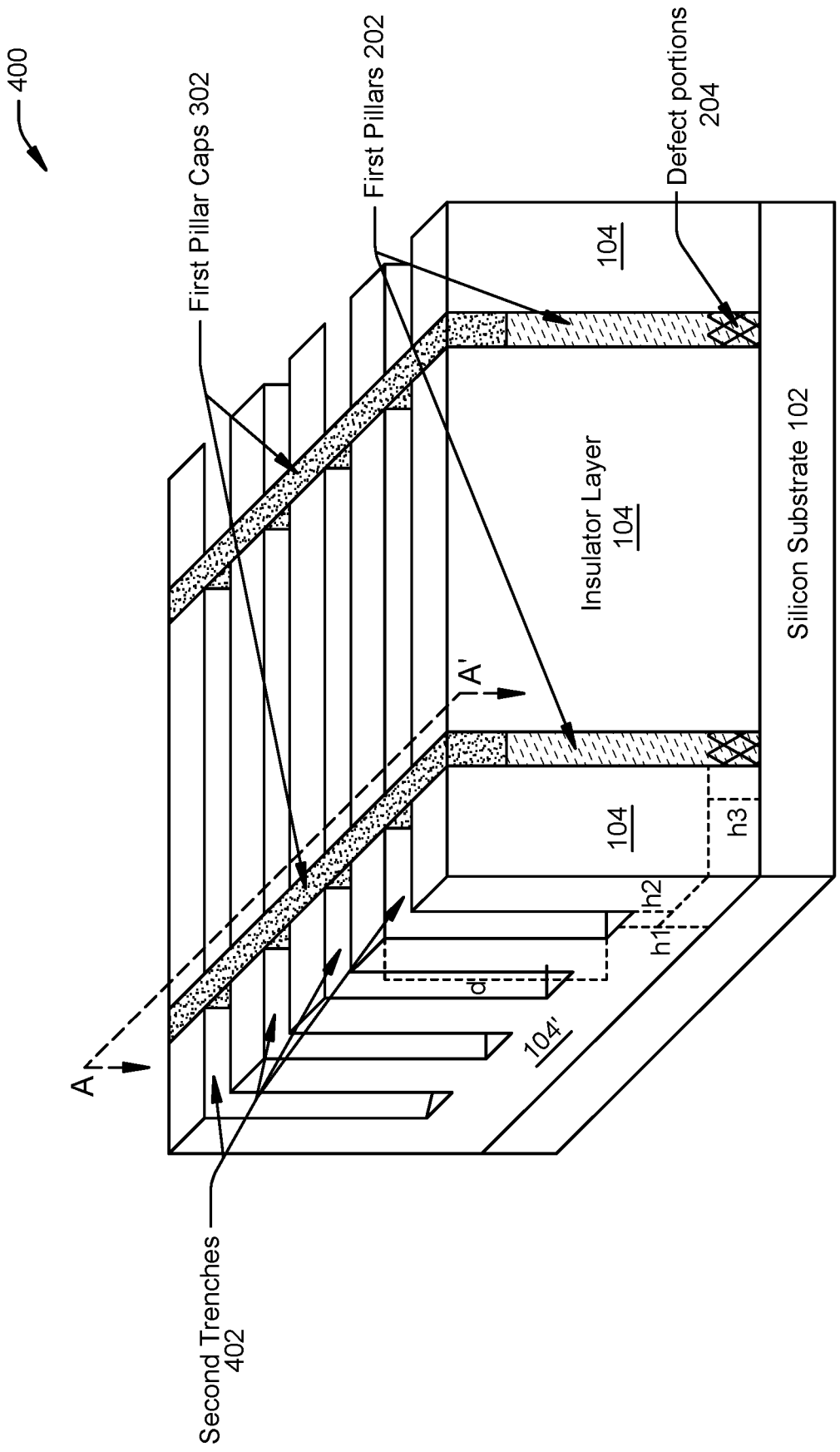
FIG. 4A presents another example intermediate semiconductor structure formed in association with an example fabrication process for forming a high mobility CMOS device with fins formed directly on the insulator layer in accordance with embodiments described herein.
Figure 4B:
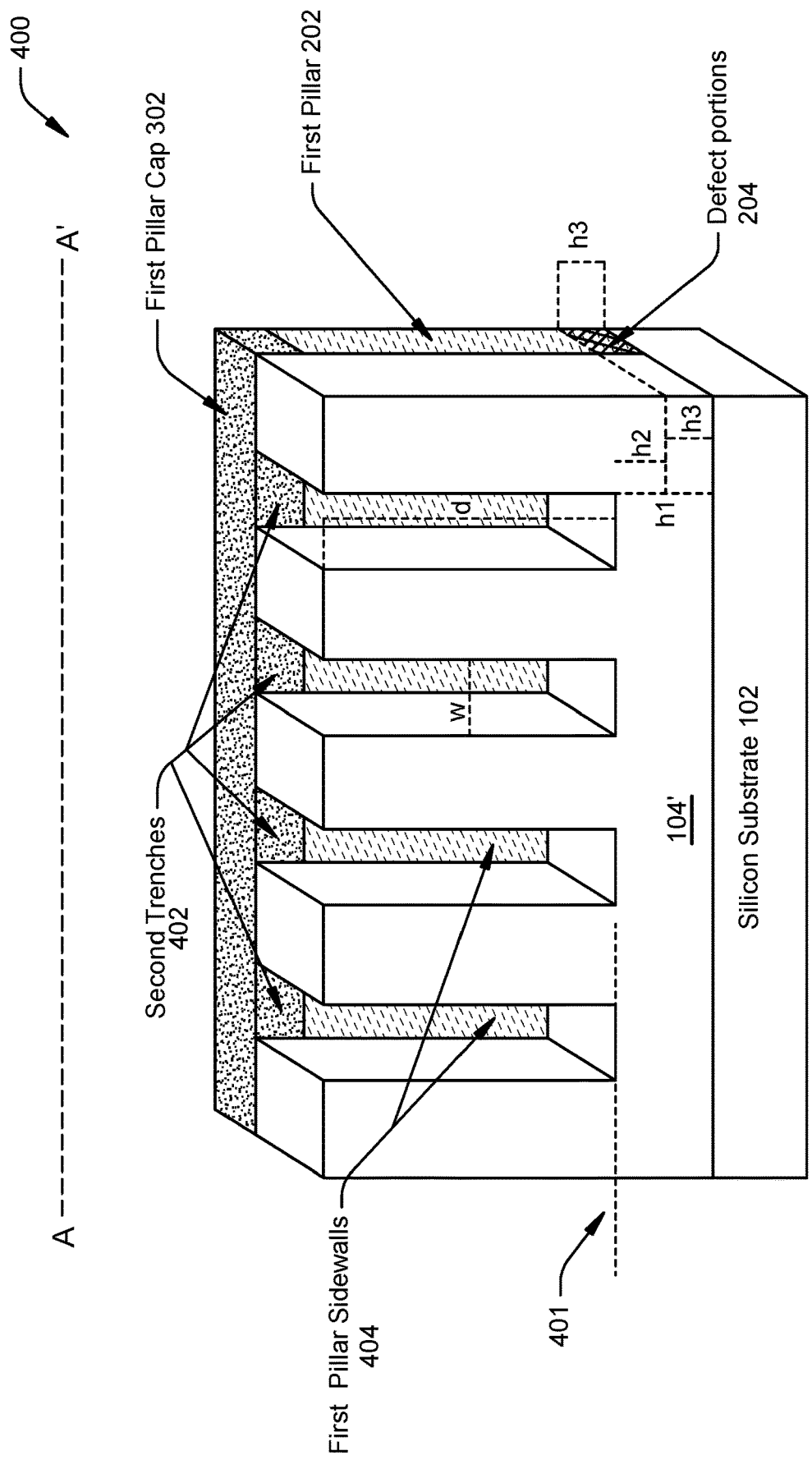
FIG. 4B presents a cross-sectional view of another example intermediate semiconductor structure formed in association with an example fabrication process for forming a high mobility CMOS device with fins formed directly on the insulator layer in accordance with embodiments described herein.

Continuing with the subject fabrication process, after the first pillar caps 302 are formed and the device is polished and planarized, the intermediate semiconductor structure 300 can be etched/patterned to form second trenches 402 within the insulator layer, as shown in FIGS. 4A and 4B. For example, FIGS. 4A and 4B respectively present another example intermediate semiconductor structure 400 that can be generated in association with the example fabrication process for forming a semiconductor structure that can be used to form high mobility CMOS devices/transistors, in accordance with embodiments described herein. FIG. 4A presents a three-dimensional view of the intermediate semiconductor structure 400 and FIG. 4B presents a cross-sectional view of the example intermediate semiconductor structure 400 take along cross-section A-A'.

With reference to FIGS. 3, 4A and 4B, in one or more embodiments, the second trenches 402 can be formed within the insulator layer 104 of intermediate semiconductor structure 300 by etching/patterning the insulator layer 104 using an etchant that is selective for the dielectric material employed for the insulator layer 104. The second trenches 402 can be orthogonal (or substantially orthogonal) to the first pillars 202. The second trenches 402 can be formed between and on either sides of the first pillars 202. The number of second trenches 402 formed can vary depending on the desired features and functionalities of one or more subsequent transistors to be formed using the resultant semiconductor structure of the subject fabrication process.

The depth d of the second trenches 402 is of particular importance. In particular, as shown in FIGS. 4A and 4B, unlike the first trenches 106 which extend all the way through the insulator layer 104 to reach the silicon substrate 102, the second trenches extend only partially through the insulator layer 104 to a depth d that stops above the defect portions 204 of the first pillars 202. As a result, as shown in FIG. 4B, only sidewalls of the upper or defect free portions of the first pillars 202 are exposed within the second trenches 402. The exposed, defect free sidewalls of the first pillars within the second trenches 402 are referred to herein as the first pillar sidewalls 404.

In addition, a lower portion of the insulator layer 104, (below dashed line 401) is left under the second trenches 402, between the silicon substrate 102 and the base of the second trenches 402. This lower portion of the insulator layer 104 is referred to herein as the lower insulator layer 104'. In this regard, the height h1 of the lower insulator layer 104' provided under the second trenches 402 can be greater than a height h3 of the defect portions 204 of the first pillars. For example, in the embodiment shown, the base of the second trenches 402 can be separated from the top of the defect portions 204 of the first pillars 202 by a space or gap having a height h2. The height h2 can vary. For example, in some implementations, the gap between the base of the second trenches 402 and the top of the defect portions 204 can be extremely small (e.g., a nanometer or less), such that the base of the second trenches 402 abuts the top surface of the defect portions 204 without exposing them. In other implementations, the gap can be increased to ensure the second trenches 402 are etched to a depth that stops above the defect portions, with less precision.

The width of w of the second trenches can be relatively narrow so as to facilitate generation of second pillars within the second trenches 402 that can be used as high mobility channel fins. In accordance with various embodiments described herein, pillars, such as the first pillars 202 and pillars subsequently formed within the second trenches 402, can be referred to as fins to indicate have a substantially narrow width (e.g., between about 1.0 nm and 30 nm). Accordingly, in some embodiments, the second trenches 402 can have a width w between 1.0 nm and 30 nm. In other embodiments, the second trenches 402 can have a width w between 2.0 nm and 20 nm. Still in yet another embodiment, the second trenches 402 can have a width w between 4.0 nm and 10 nm.

Figure 5:
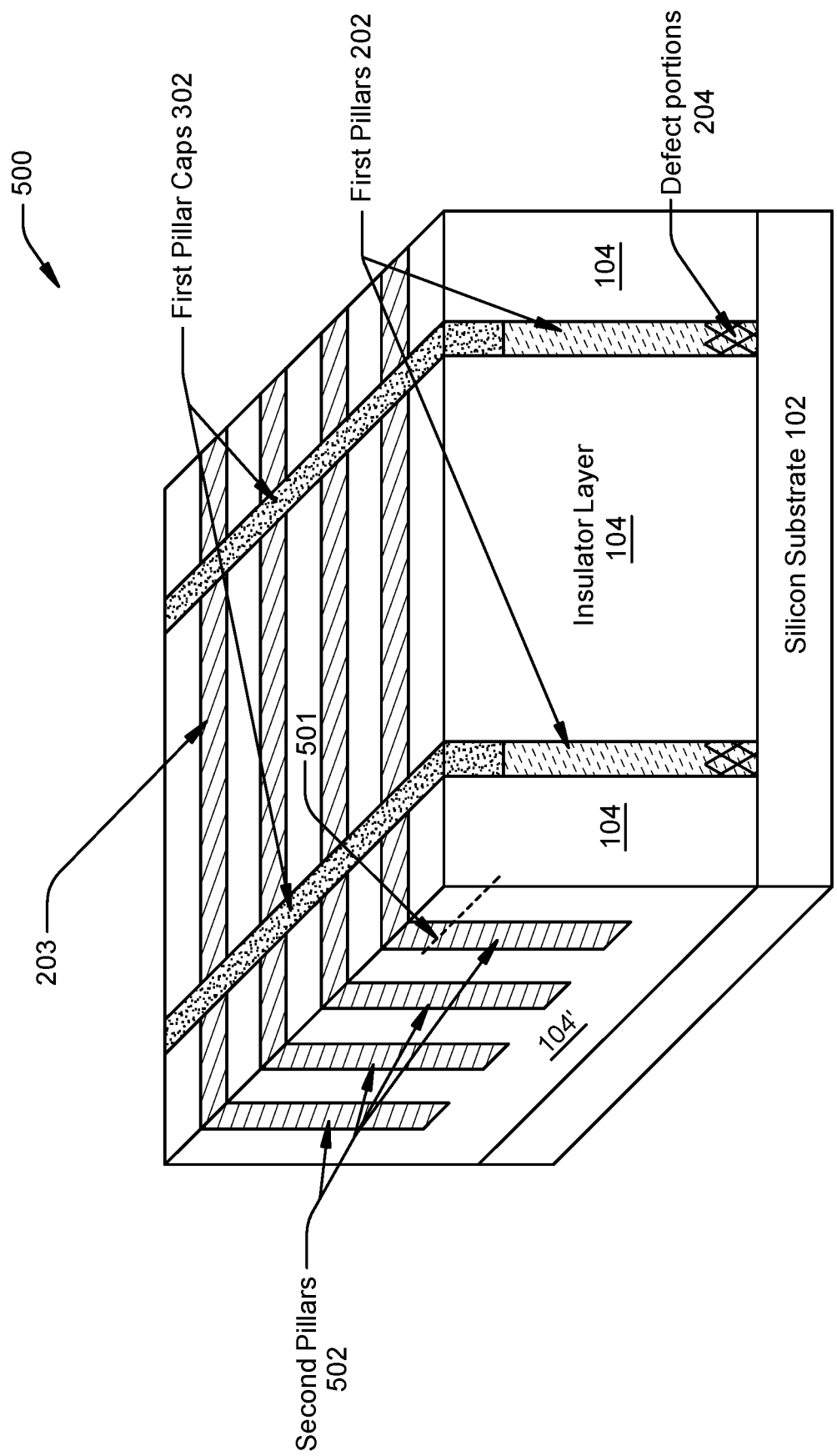
FIG. 5 presents another example intermediate semiconductor structure formed in association with an example fabrication process for forming a high mobility CMOS device with fins formed directly on the insulator layer in accordance with embodiments described herein.

FIG. 5 presents another example intermediate semiconductor structure 500 that can be generated in association with the example fabrication process for forming a semiconductor structure that can be used to form high mobility CMOS devices/transistors, in accordance with embodiments described herein. FIG. 5 demonstrates formation of second pillars 502 within the second trenches 402 of intermediate semiconductor structure 400, thereby resulting in intermediate semiconductor structure 500.

With reference to FIGS. 4A, 4B and 5, in accordance with one or more embodiments, the second pillars 502 can be formed within the second trenches 402 via epitaxial growth using the exposed, defect free, first pillar sidewalls 404 as seeds. In this regard, the second pillars 502 can be grown laterally from the first pillar sidewalls 404. The material employed for the second pillars 502 can comprise a high mobility material that is lattice matched to the material of the first pillars 202. As a result, the second pillars 502 comprise virtually no (or extremely low) epitaxial defects while also being formed with a high mobility material, thereby rendering them optimal candidates for high mobility channel fins for CMOS transistors.

Because the lattice constant of the second pillar material should match the lattice constant of the first pillar material, the material employed for the second pillars 502 depends on the lattice constant of the material employed for the first pillars 202, and vice versa. For example, in one embodiment in which Ge is used for the first pillars 202, the second pillars can be formed with GaAs, which is lattice matched with Ge. In other embodiments, the material employed for the first pillars 202 and the second pillars 502 can be the same (e.g., Ge/Ge, GaAs/GaAs, etc.). Some suitable high mobility materials that can be employed for the second pillars 502 can include but are not limited to: Ge, SiGe, semiconductor III-V compounds and semiconductor II-VI compounds.

The material employed for the second pillars 502 can also depend on whether they will be used for channels in nFET or pFET device. For example, in implementations in which the intermediate semiconductor structure 500 will be used to form an nFET device, the material employed for the second pillars 502 can comprise a high electron carrier mobility material, such as GaAs. Likewise, in implementations in which the intermediate semiconductor structure 500 will be used to form a pFET device, the material employed for the second pillars 502 can comprise a high hole carrier mobility material, such as Ge. In other embodiments, the second pillars 502 can be formed with two or more different types of high mobility materials. For example, in one embodiment, a first subset of the second pillars 502 can be formed using a high electron carrier mobility material (e.g., GaAs) and a second subset of the second pillars 502 can be formed using a high hole carrier mobility material (e.g., Ge), thereby facilitating formation of both an nFET and a pFET on the same silicon substrate 102.

In some embodiments, after the second pillars 502 are formed within the second trenches 402, the top surface 203 of the intermediate semiconductor structure 500 can be polished to planarize and smooth the top surface 203. This polishing step can be used for example to remove any excess overgrowth of the second pillars 502 above the top surface 203 of the insulator layer 104 and/or the first pillar caps 302.

Figure 6:
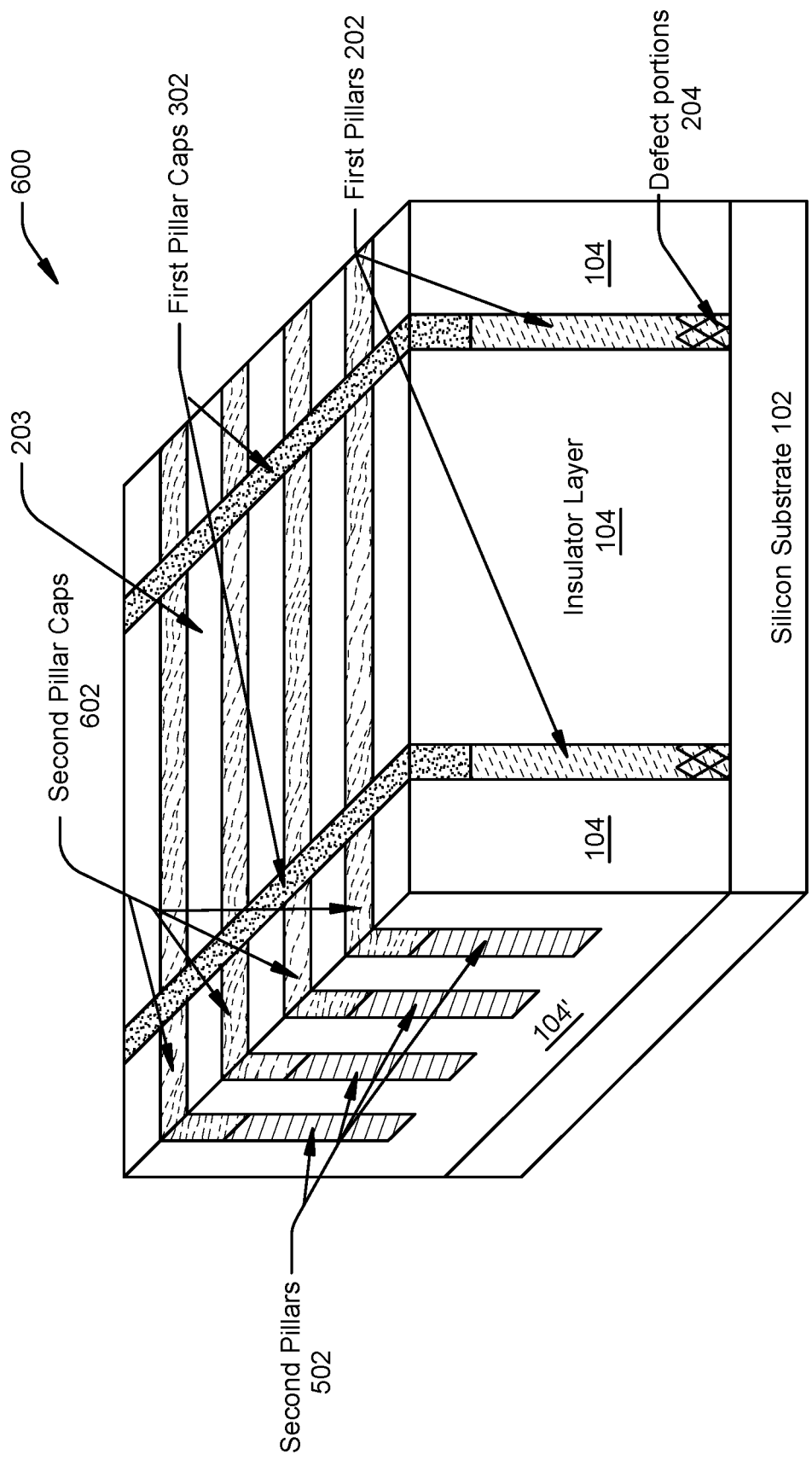
FIG. 6 presents another example intermediate semiconductor structure formed in association with an example fabrication process for forming a high mobility CMOS device with fins formed directly on the insulator layer in accordance with embodiments described herein.

FIG. 6 presents another example intermediate semiconductor structure 600 that can be generated in association with the example fabrication process for forming a semiconductor structure that can be used to form high mobility CMOS devices/transistors, in accordance with embodiments described herein. In the embodiment shown, second pillar caps 602 (shown in red) are formed on and adjacent to top portions of the second pillars 502.

With reference to FIGS. 5 and 6, in accordance with one or more embodiments, the second pillar caps 602 can be formed be recessing a small, top section of the second pillars 502 using an etchant that is selective to the second pillar material (and which does not remove the first pillar caps and the insulator layer 104), and then depositing a dielectric material within the recess, thereby forming the intermediate semiconductor structure 600. For example, with reference to FIG. 5, the top sections of the second pillars 502 above dashed reference line 501 can be removed to form recesses (not shown) within the insulator layer 104 directly above the second pillars 502. The recesses can then be filled with a dielectric material to form the second pillar caps 602. In some embodiments, after the second pillar caps 602 are formed, the top surface 203 of the intermediate semiconductor structure 600 another polishing step can be performed to smooth and planarize the top surface 203 of the device.

Like the first pillar caps 302, the second pillar caps 602 can serve as masks to temporarily protect the second pillars 502 in association with subsequent etching and patterning steps of the fabrication process. Accordingly, the material of the second pillar caps 602 can comprise a dielectric material that facilitates selective etching of other layers of the intermediate semiconductor structure 600 relative to the second pillar caps 602 (and subsequent intermediate semiconductor devices described infra). In this regard, the material employed for the second pillar caps 602 can comprise a dielectric material that has a substantially resistant etch rate for one or more specific etchants relative to the insulator layer 104 and the first pillar caps 302, such that the insulator layer 104 and the first pillar caps 302 can be selectively etched without removing the second pillar caps 602. Thus, the material employed for the second pillar caps 602 depends on the material employed for the insulator layer 104 and the first pillar caps 302. For example, in one embodiment in which the insulator layer 104 comprises an oxide and the first pillar caps 302 comprise a nitride, such as SiN, the second pillar caps 602 can comprise, but not limited to, aluminum oxide ($Al_2O_3$) and hafnium oxide ($HfO_2$).

Continuing with the subject fabrication process, after the second pillar caps 602 are formed and the intermediate semiconductor structure 600 is polished and planarized to remove any excess second pillar cap material). The intermediate semiconductor structure 600 can then be etched/patterned to remove the first pillar caps 302 and the underlying, first pillars 202 to form isolation trenches 702 between the second pillars 502, as shown in FIG. 7.

Figure 7:
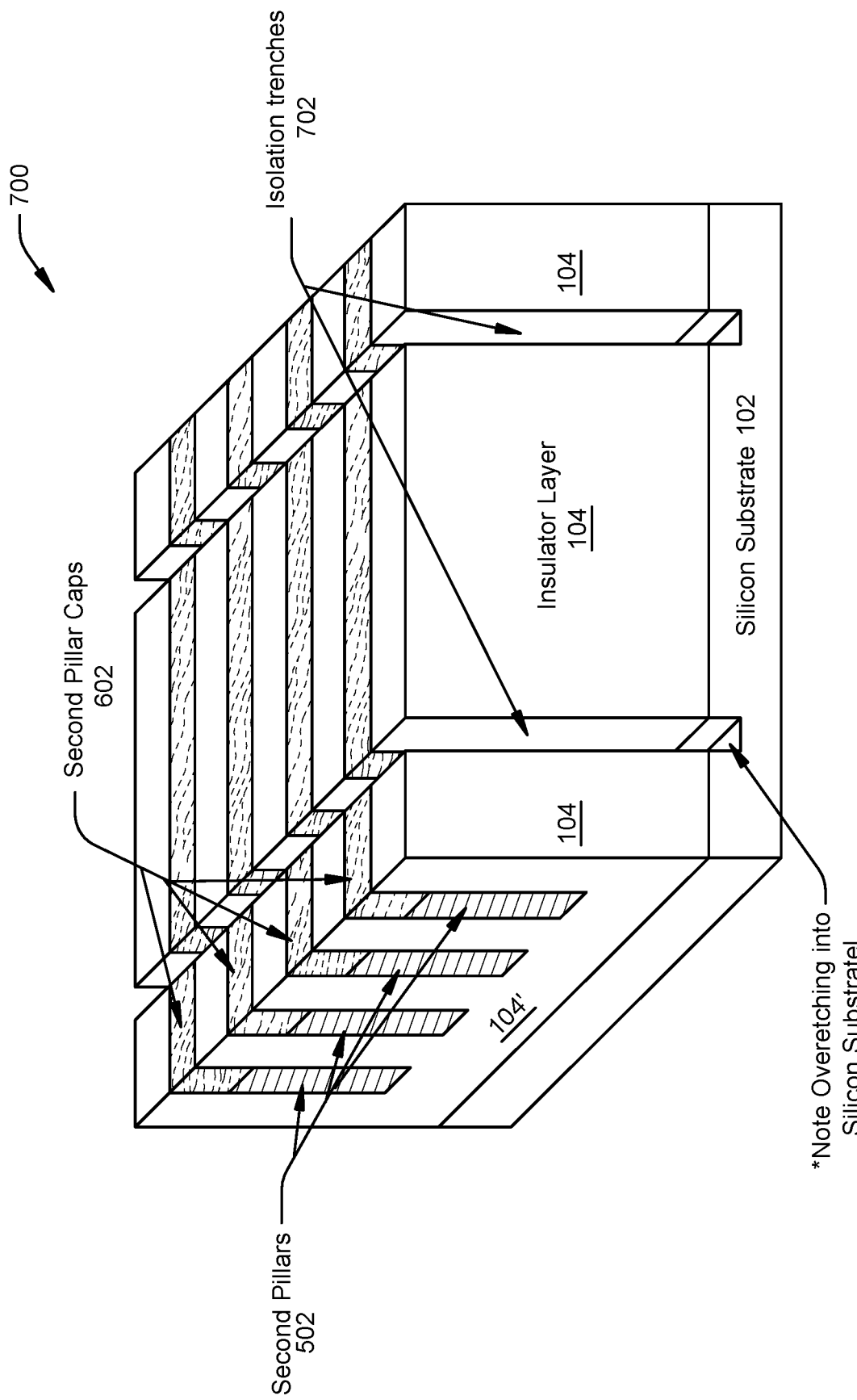
FIG. 7 presents another example intermediate semiconductor structure formed in association with an example fabrication process for forming a high mobility CMOS device with fins formed directly on the insulator layer in accordance with embodiments described herein.

For example, FIG. 7 presents another example intermediate semiconductor structure 700 that can be generated in association with the example fabrication process for forming a semiconductor structure that can be used to form high mobility CMOS devices/transistors, in accordance with embodiments described herein. In the embodiment shown, the first pillar caps 302 and the first pillars 202 have been removed. In one or more embodiments, the first pillar caps 302 and the first pillars 202 can be removed from intermediate semiconductor structure 600 using one or more etchants that are selective toward the material of the first pillar caps 302 and the material of the first pillars 202, respectively. For example, the isolation trenches 702 can be formed using a two-step etching process, wherein the first pillar caps 302 are removed using a first etchant that is selective toward the first pillar cap material, and wherein the first pillars are thereafter removed using a second etchant that is selective toward the first pillar cap material.

In the embodiment shown, the isolation trenches 702 extend through the insulator layer and into the silicon substrate 102. In accordance with this embodiment, the isolation trenches 702 can be formed into a portion of the silicon substrate 102 to ensure the entirety of the defect portions 204 of the first pillars are removed. However, in other embodiments, the isolation trenches 702 can abut the top surface of the silicon substrate 102.

Figure 8:
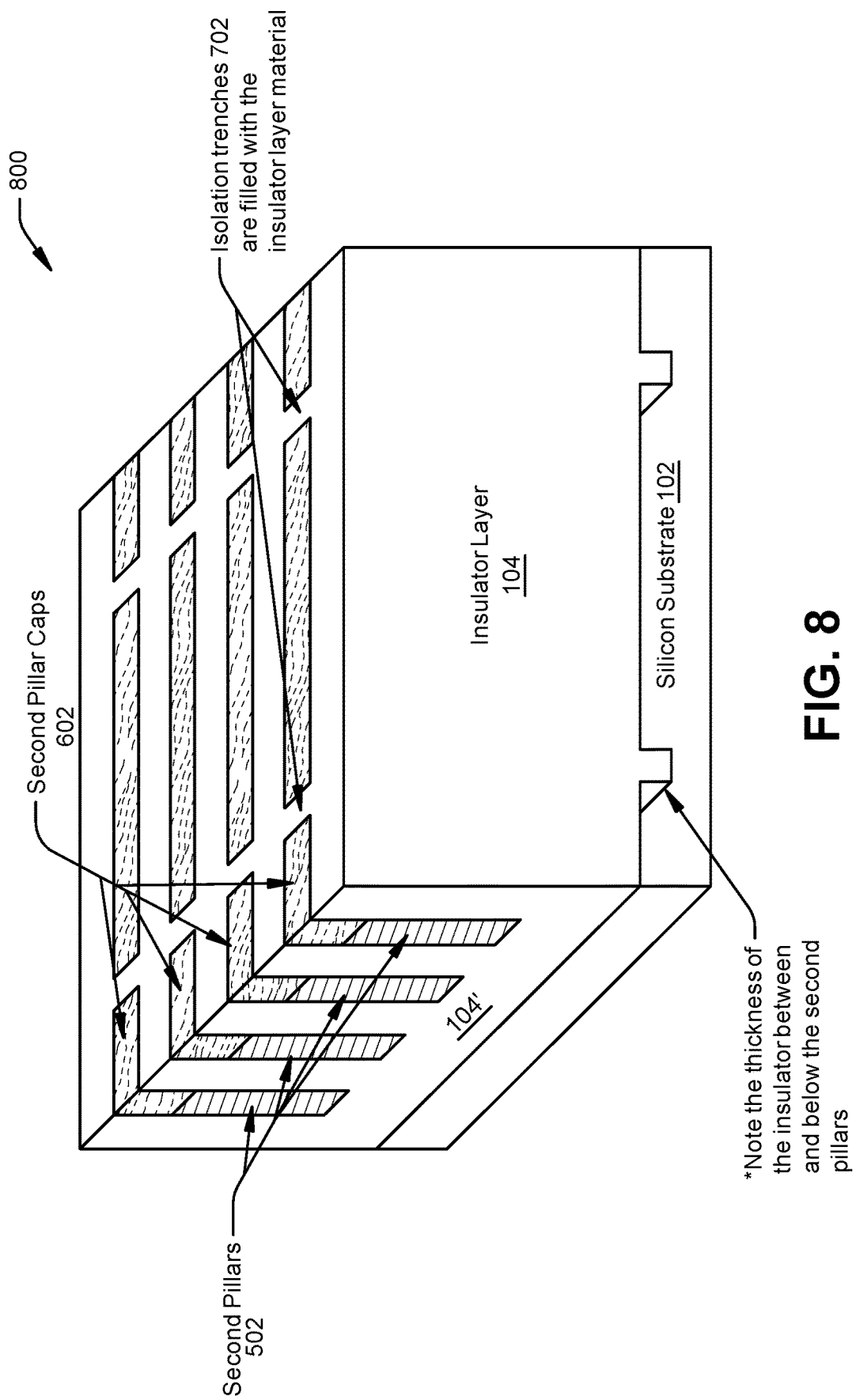
FIG. 8 presents another example intermediate semiconductor structure formed in association with an example fabrication process for forming a high mobility CMOS device with fins formed directly on the insulator layer in accordance with embodiments described herein.

FIG. 8 presents another example intermediate semiconductor structure 800 that can be generated in association with the example fabrication process for forming a semiconductor structure that can be used to form high mobility CMOS devices/transistors, in accordance with embodiments described herein. With reference to FIGS. 7 and 8, after the isolation trenches 702 are formed, the isolation trenches 702 can be filled with a dielectric material (e.g., SiN, SiN and a liner+oxide, $SiO_2$ etc.), thereby generating the intermediate semiconductor structure 800. As a result, the second pillars 502 are isolated from one another by a dielectric material. In the embodiment shown, the insulator or dielectric material that is used to fill the isolation trenches is formed within the (over-etched) isolation trenches 702 to ensure isolation between the second pillars 502. As a result, a thickness of the lower insulator layer 401' can vary below and between the second pillars 502.

Figure 9:
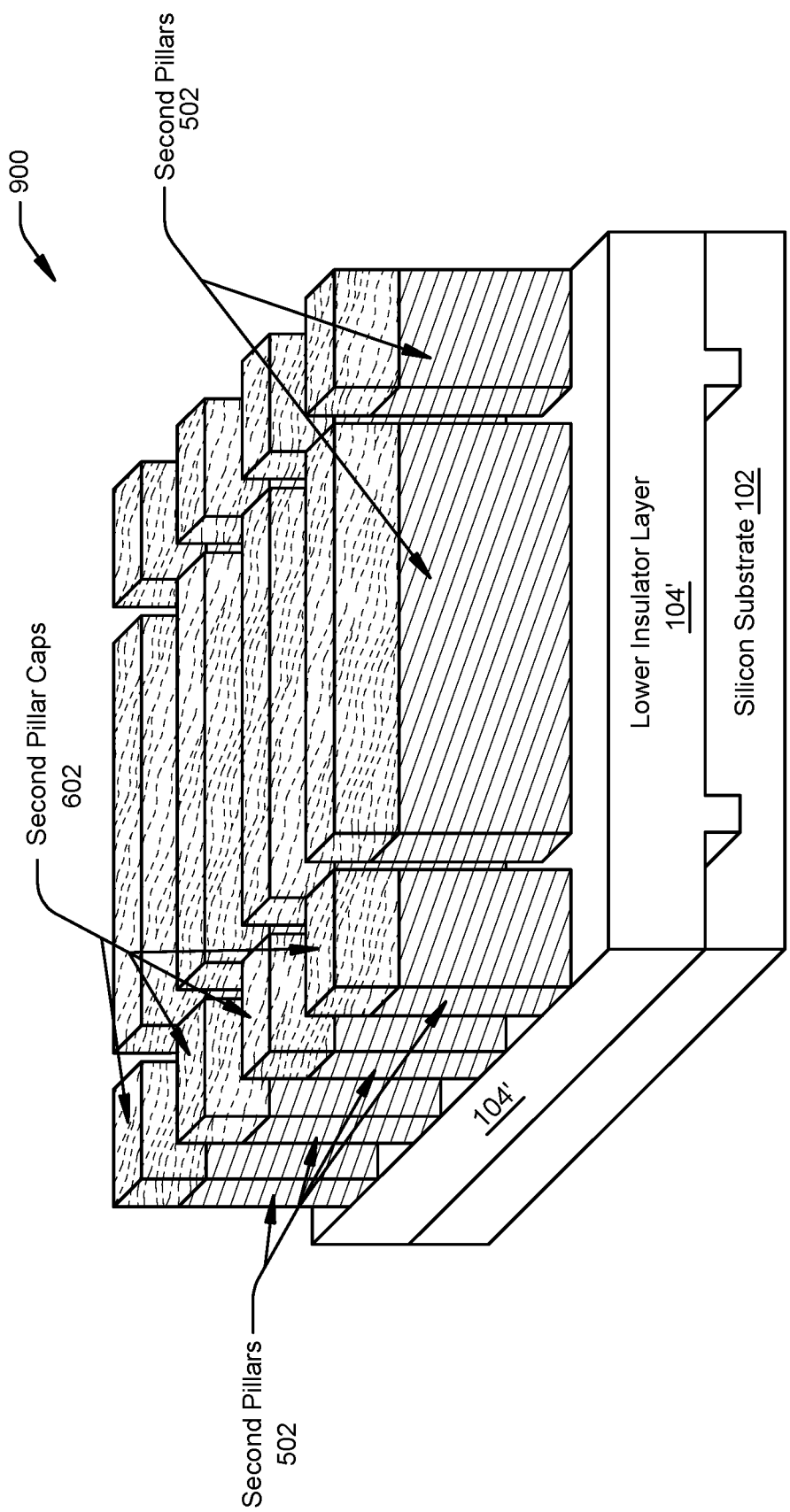
FIG. 9 presents another example intermediate semiconductor structure formed in association with an example fabrication process for forming a high mobility CMOS device with fins formed directly on the insulator layer in accordance with embodiments described herein.

FIG. 9 presents another example intermediate semiconductor structure 900 that can be generated in association with the example fabrication process for forming a semiconductor structure that can be used to form high mobility CMOS devices/transistors, in accordance with embodiments described herein. With reference to FIGS. 8 and 9, after the isolation trenches 702 are filled with dielectric or insulator material, the upper portion of the insulator layer 104 above and/or around the second pillars 502 and the second pillar caps 602 (e.g., the entirety of the insulator layer 104, excluding lower insulator layer 104') can be removed to expose the second pillars 502. The recession of the insulator layer 104 can thus stop above the lower insulator layer 104', thereby generating the intermediate semiconductor structure 900 with second pillars 502 formed on the lower insulator layer 104'. In some embodiments, the insulator layer 104 can be etched/removed using an etchant that is selective for the insulator layer 104 material and does not remove the second pillar caps 602. In this regard, the second pillar caps 602 can protect the second pillars 502 from being removed during this etchant step to expose the second pillars 502.

Figure 10:
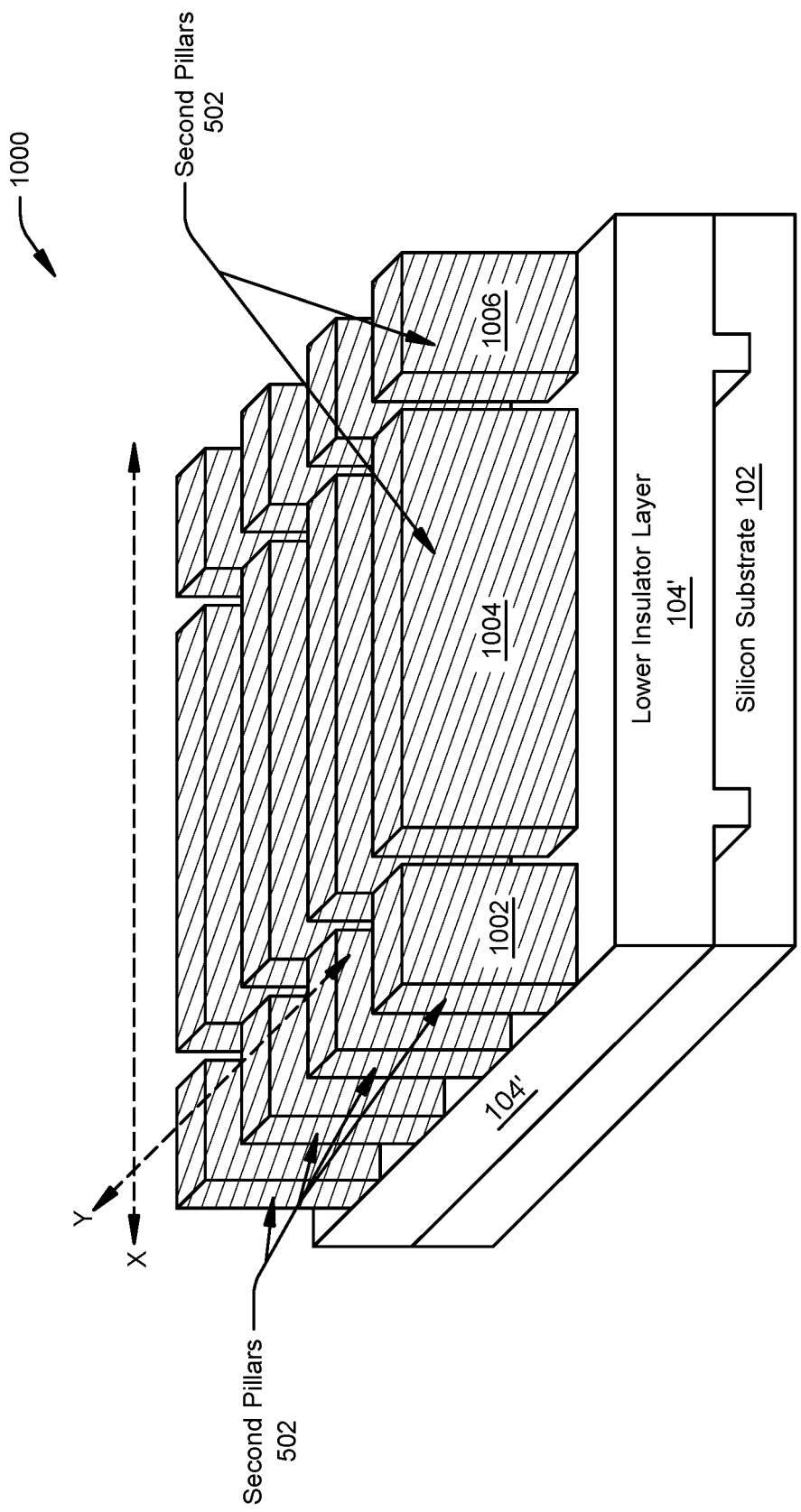
FIG. 10 presents an example semiconductor structure that can be used to form one or more high mobility CMOS devices with fins formed directly on the insulator layer in accordance with embodiments described herein.

After the second pillars 502 are exposed, the second pillar caps 602 can be removed to form semiconductor structure 1000, as shown in FIG. 10. For example, the second pillar caps 602 can be removed using an etchant that is selective toward the second pillar caps 602. The semiconductor structure 1000 can be used to form one or more transistors, including CMOS transistors, pFET devices, nFET devices, FinFET devices, vertical transistors, and the like.

As shown in FIG. 10, the second pillars 502 are arranged on the lower insulator layer 104' in rows (along the X-axis) and columns (along the Y-axis), wherein each row of the second pillars 502 comprises three isolated sections, respectively identified in FIG. 10 as section 1002, section 1004, and section 1006. The respective second pillars can have a same height (or substantially same height). Each section of the sections 1002, 1004, 1006 can be used to form multiple transistors. In this regard, a single transistor can be formed on a single continuous fin, wherein each of the sections 1002, 1004 and 1006 correspond to continuous fins. Each section of fin forms a group of transistors.

Figure 11:
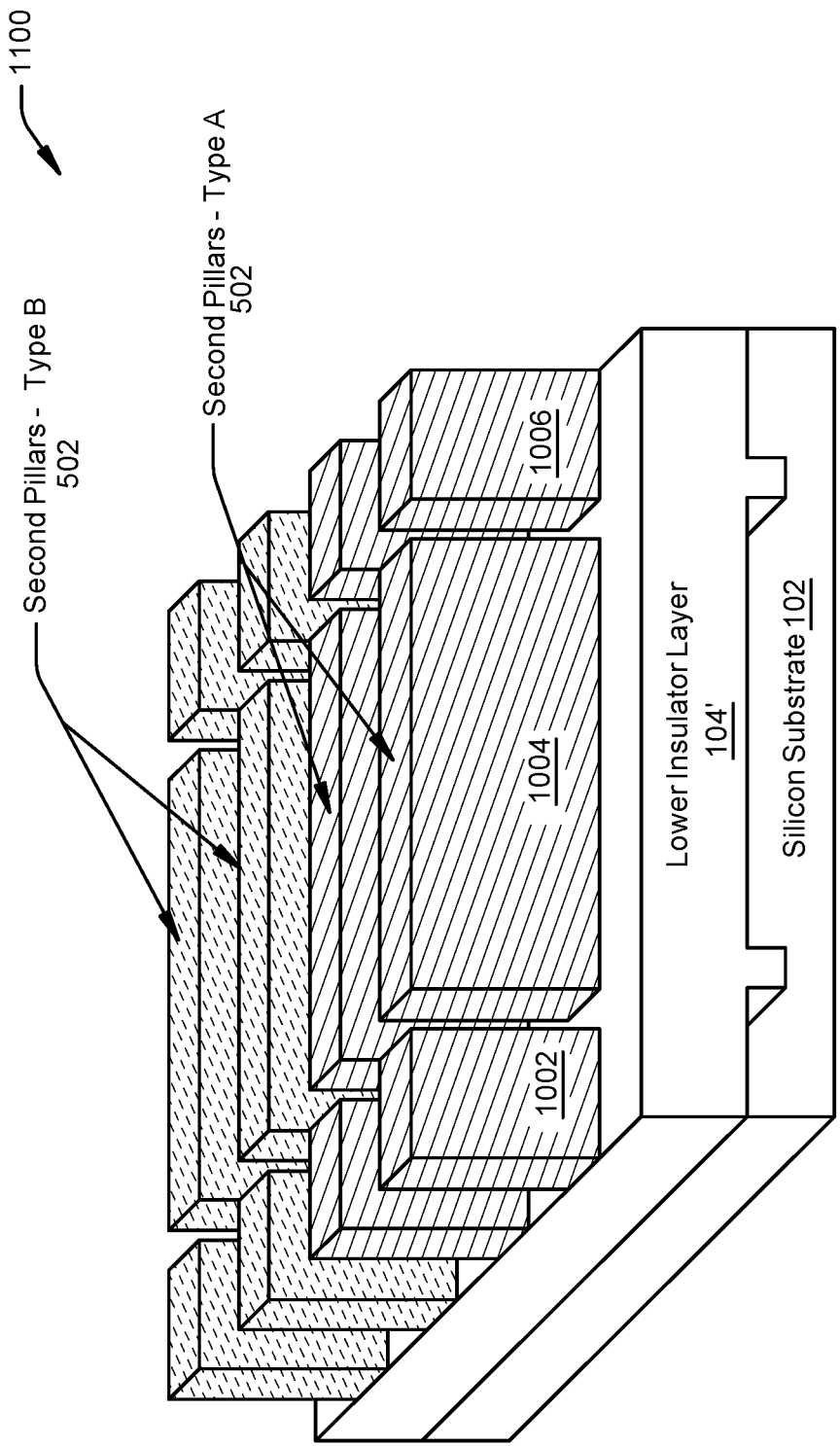
FIG. 11 presents another example semiconductor structure that can be used to form one or more high mobility CMOS devices with fins formed directly on the insulator layer in accordance with embodiments described herein.

FIG. 11 presents another example semiconductor structure 1100 that can be used to form one or more high mobility CMOS devices with fins formed directly on the insulator layer in accordance with embodiments described herein. Semiconductor structure 1100 can include substantially same or similar features and functionalities as semiconductor structure 1000. In this regard, semiconductor structure 1100 can be generated using the fabrication process demonstrated with reference to FIGS. 1-10. Semiconductor structure 1100 differs from semiconductor structure 1000 with respect to the material used for the second pillars 502. For example, in the embodiment shown, the second pillars 502 include a first set of pillars formed with a first high mobility material of Type A, and a second set of pillars formed with a second, high mobility material of Type B. In one or more embodiments, the Type A material can comprise a high electron carrier mobility material (e.g., GaAs), and the Type B material can comprise a high hole carrier mobility material (e.g., Ge). As a result, the semiconductor structure 1100 can be used to form both an nFET and a pFET on the same silicon substrate 102.

Figure 12A:
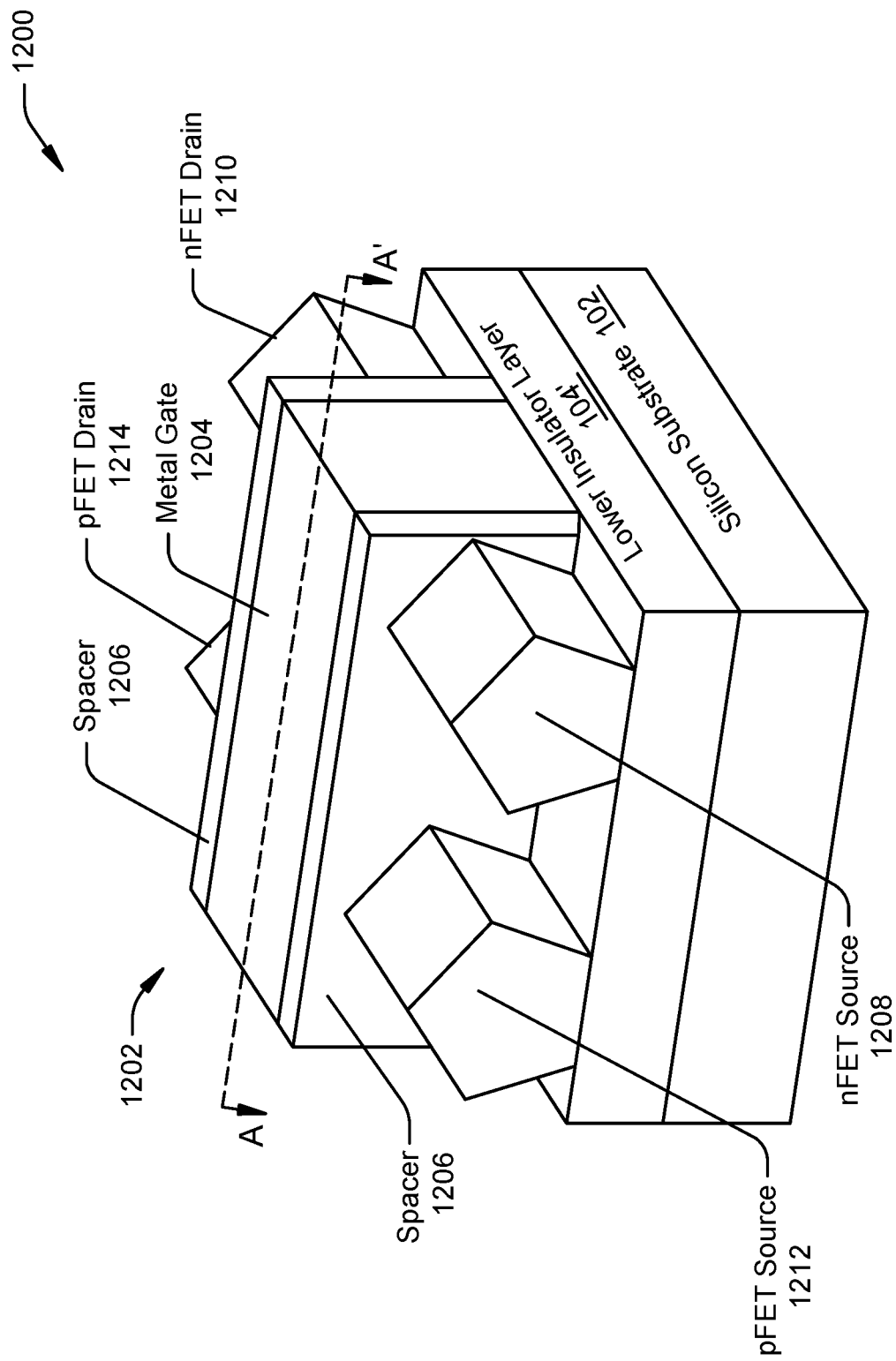
FIG. 12A presents an example high mobility CMOS device with fins formed directly on the insulator layer in accordance with embodiments described herein.
Figure 12B:
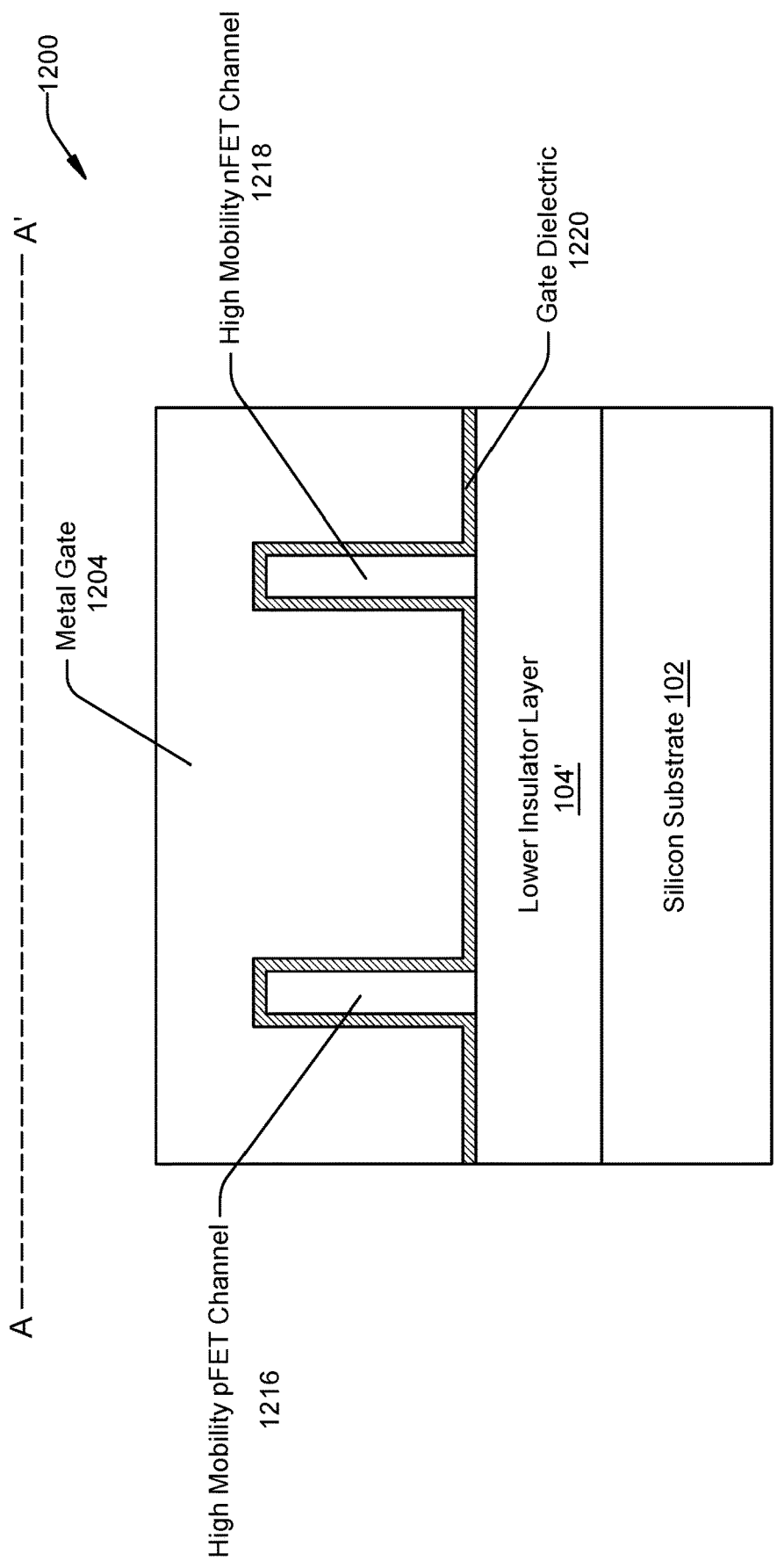
FIG. 12B presents a cross-sectional view of the example high mobility CMOS device with fins formed directly on the insulator layer in accordance with embodiments described herein.

FIGS. 12A and 12B present an example high mobility CMOS device 1200 with fins formed directly on the insulator layer in accordance with embodiments described herein. FIG. 12A presents a three-dimensional view of the high mobility CMOS device 1200, and FIG. 12B presents a cross-sectional view of the high mobility CMOS device 1200 taken along axis A-A'. In one or more embodiments, the high mobility CMOS device 1200 can be formed using semiconductor structure 1100 continuing CMOS fabrication in accordance with traditional CMOS transistor fabrication techniques (e.g., including dummy gate formation, spacer formation, source and drain (S/D) epitaxy, replacement metal gate (RMG) processing and contact formation). Repetitive description of like elements employed in respective embodiments is omitted for sake of brevity.

With reference to FIG. 12A, in the embodiment shown, the high mobility CMOS device 1200 comprises the lower insulator layer 104' of the semiconductor structure 1100 formed on the silicon substrate 102. The high mobility CMOS device 1200 formed using the semiconductor structure 1100 further comprises a gate stack 1202 formed on the lower insulator layer 104'. The gate stack 1202 can comprise a metal gate 1204 formed over an active region of the high mobility CMOS device 1200. In one or more embodiments, the metal gate 1204 can comprise a RMG (or another suitable type of gate). Spacers 1206 can be formed on either side of the gate stack 1202. The high mobility CMOS device 1200 comprises two transistors, a pFET and an nFET. In this regard, as shown in FIG. 12B, the active region of the high mobility CMOS device 1200 located within the gate stack 1202 can comprise a high mobility pFET channel 1216 and a high mobility nFET channel 1218. A gate dielectric layer 1220 can further be provided between the metal gate 1204 and the surfaces of the lower insulator layer 104' and the respective high mobility channels.

With reference to FIGS. 11 and 12B, in accordance with one or more embodiments, the high mobility pFET channel 1216 can be formed using the second pillars 502 of Type B of the semiconductor structure 1100. Likewise, the high mobility nFET channel 1218 can be formed using the second pillars 502 of Type A of the semiconductor structure 1100. In this regard, the second pillars 502 of the semiconductor structure 1100 can function as high mobility channel fins of the high mobility CMOS device 1200.

With reference again to FIG. 12A, the high mobility CMOS device 1200 can further include corresponding source and drain regions S/D regions for the respective pFET and nFET transistors on opposite sides of the gate stack 1202. For example, in the embodiment shown, a pFET source region 1212 and a pFET drain region 1214 can be formed on the lower insulator layer 104' on either side of the gate stack 1202, wherein high mobility pFET channel 1216 below/within the gate stack 1202 is located between the pFET source region 1212 and the pFET drain region 1214. Likewise, an nFET source region 1208 and an nFET drain region 1210 can be formed on the lower insulator layer 104' on either side of the gate stack 1202, wherein high mobility nFET channel 1218 is located below/within the gate stack 1202 and between the nFET source region 1208 and the nFET drain region 1210. In one or more embodiments, the respective S/D regions can be formed via epitaxial growth of a suitable S/D material.

Figure 13:
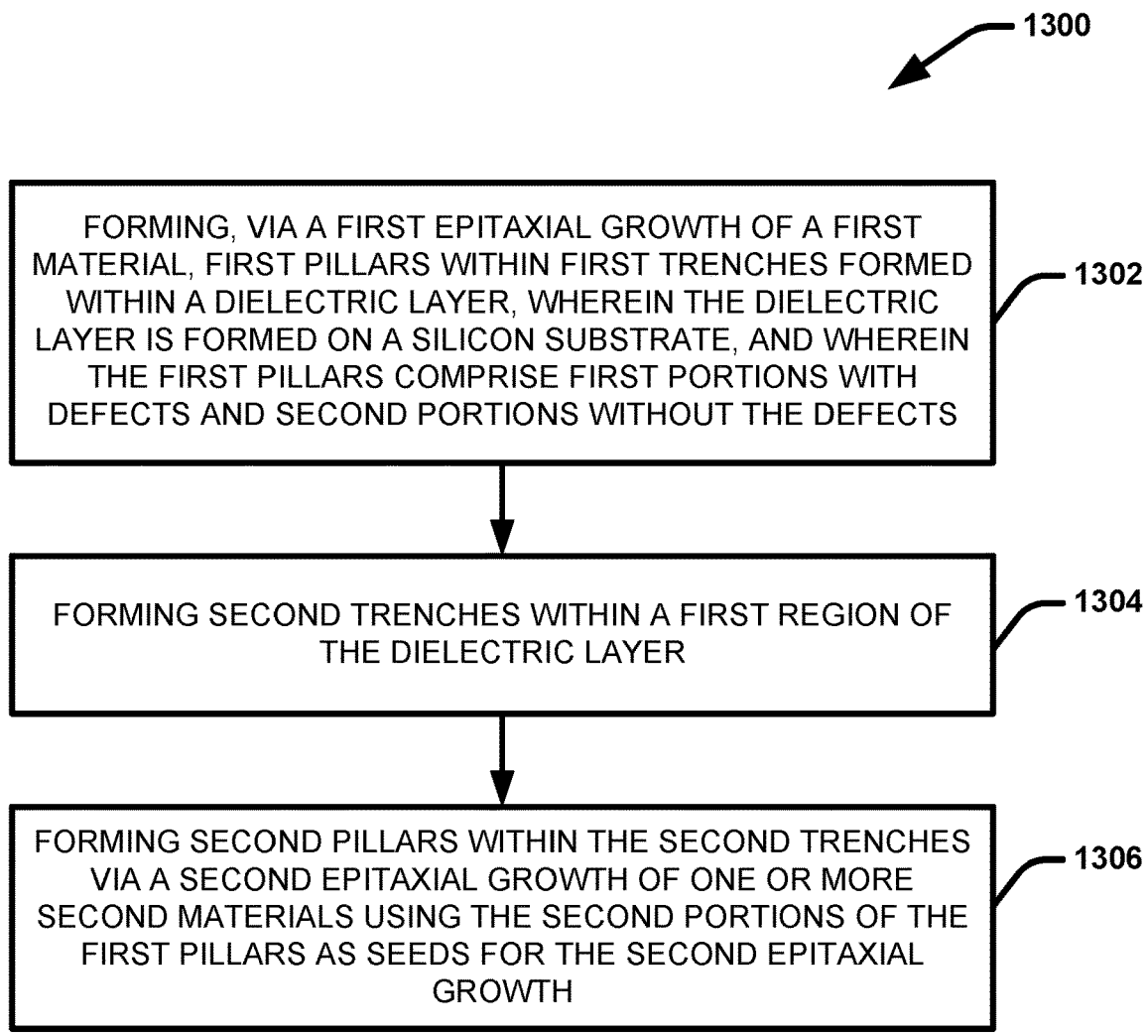
FIG. 13 presented an example, high level flow diagram of an example method for fabricating one or more high mobility CMOS devices with high mobility channel fins formed on the insulator layer, in accordance with one or more embodiments of the disclosed subject matter.
Figure 14:
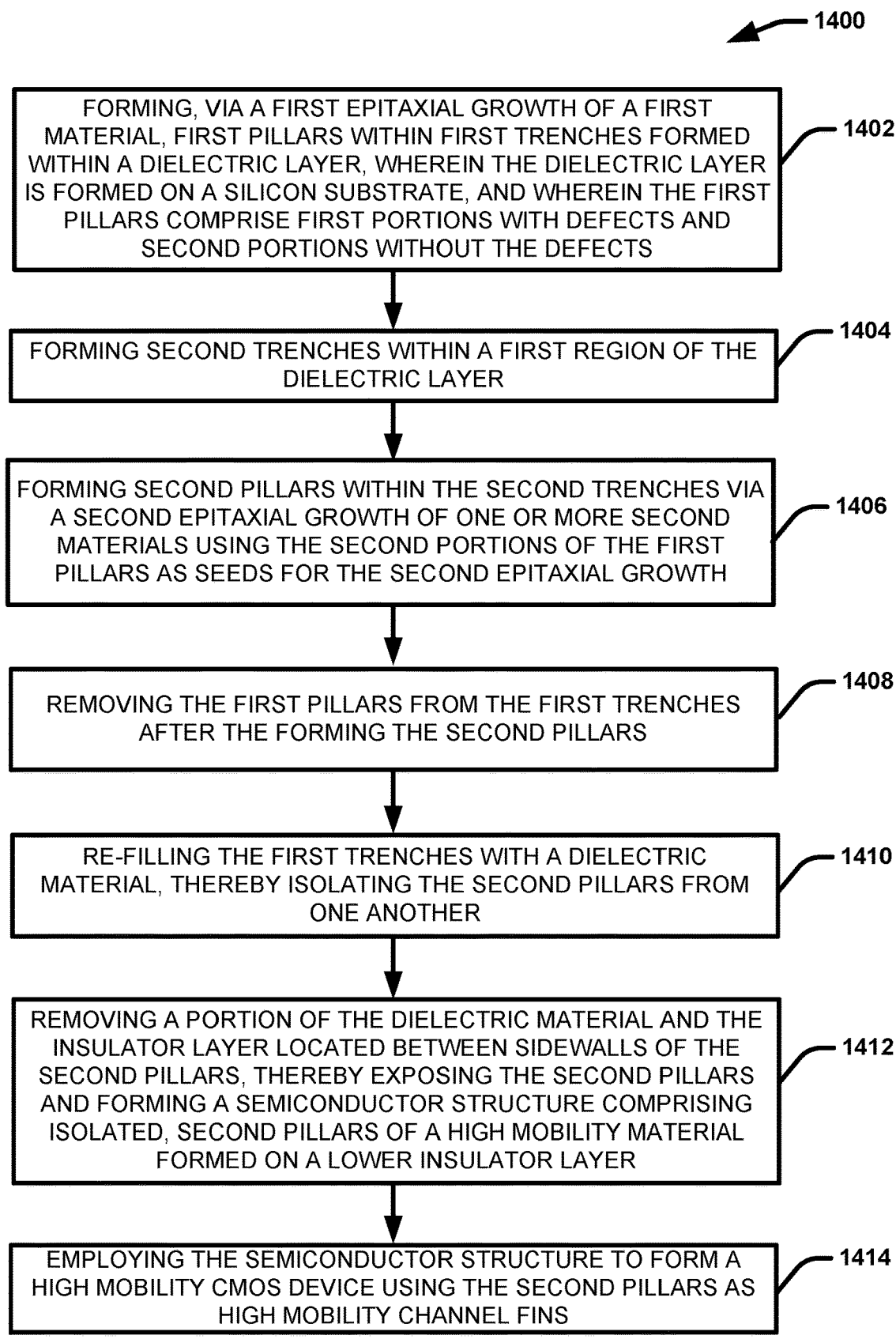
FIG. 14 presented an example, high level flow diagram of another example method for fabricating one or more high mobility CMOS devices with high mobility channel fins formed on the insulator layer, in accordance with one or more embodiments of the disclosed subject matter

FIGS. 13-14 illustrate flow diagrams of example, non-limiting methods for fabricating one or more high mobility CMOS devices with high mobility channel fins formed on the insulator layer. While, for purposes of simplicity of explanation, the methodologies are shown and described as a series of acts, the disclosed subject matter is not limited by the order of acts, as some acts can occur in different orders and/or concurrently with other acts from that shown and described herein. For example, those skilled in the art will understand and appreciate that a methodology can alternatively be represented as a series of interrelated statuses or events, such as in a state diagram. Moreover, not all illustrated acts may be required to implement a methodology in accordance with the disclosed subject matter.

Referring now to FIG. 13 presented an example, high level flow diagram of an example method 1300 for fabricating one or more high mobility CMOS devices with high mobility channel fins formed on the insulator layer, in accordance with one or more embodiments of the disclosed subject matter. Repetitive description of like elements employed in respective embodiments is omitted for sake of brevity.

At 1302, first pillars are formed, via a first epitaxial growth, within first trenches formed within a dielectric layer, wherein the dielectric layer is formed on a silicon substrate, and wherein the first pillars comprise first portions with defects and second portions without the defects. At 1304 second trenches are formed within a first region of the dielectric layer (e.g., the upper region of the insulator layer 104 above the lower insulator layer 104'). A 1306 second pillars are formed within the second trenches via a second epitaxial growth of one or more second materials using the second portions of the first pillars as seeds for the second epitaxial growth.

FIG. 14 presented an example, high level flow diagram of another example method 1400 for fabricating one or more high mobility CMOS devices with high mobility channel fins formed on the insulator layer, in accordance with one or more embodiments of the disclosed subject matter. Repetitive description of like elements employed in respective embodiments is omitted for sake of brevity.

At 1402, first pillars are formed, via a first epitaxial growth, within first trenches formed within a dielectric layer, wherein the dielectric layer is formed on a silicon substrate, and wherein the first pillars comprise first portions with defects and second portions without the defects. At 1404 second trenches are formed within a first region of the dielectric layer (e.g., the upper region of the insulator layer 104 above the lower insulator layer 104'). A 1406 second pillars are formed within the second trenches via a second epitaxial growth of one or more second materials using the second portions of the first pillars as seeds for the second epitaxial growth. At 1408, the first pillars are removed from the first trenches after the formation of the second pillars. At 1410, the first trenches (e.g., now corresponding to the isolation trenches 702) are re-filled with a dielectric material, thereby isolating the second pillars from one another. At 1412, a portion of the dielectric material and the insulator layer located between sidewalls of the second pillars is removed, thereby exposing the second pillars and forming a semiconductor structure (e.g., semiconductor structure 1000, 1100 and the like) comprising isolated, second pillars of a high mobility material formed on a lower insulator layer (e.g., lower insulator layer 104'), (and defect free). Then at 1414, the semiconductor structure can be employed to form a high mobility CMOS device (e.g., high mobility CMOS device 1200), using the second pillars as high mobility channel fins.

What has been described above includes examples of the embodiments of the present invention. It is, of course, not possible to describe every conceivable combination of components or methodologies for purposes of describing the claimed subject matter, but it is to be appreciated that many further combinations and permutations of the subject innovation are possible. Accordingly, the claimed subject matter is intended to embrace all such alterations, modifications, and variations that fall within the spirit and scope of the appended claims. Moreover, the above description of illustrated embodiments of the subject disclosure, including what is described in the Abstract, is not intended to be exhaustive or to limit the disclosed embodiments to the precise forms disclosed. While specific embodiments and examples are described in this disclosure for illustrative purposes, various modifications are possible that are considered within the scope of such embodiments and examples, as those skilled in the relevant art can recognize.

In this regard, with respect to any figure or numerical range for a given characteristic, a figure or a parameter from one range may be combined with another figure or a parameter from a different range for the same characteristic to generate a numerical range. Other than in the operating examples, or where otherwise indicated, all numbers, values and/or expressions referring to quantities of ingredients, reaction conditions, etc., used in the specification and claims are to be understood as modified in all instances by the term "about."

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of appended claims, and equivalents thereof.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

Moreover, the words "example" or "exemplary" are used in this disclosure to mean serving as an example, instance, or illustration. Any aspect or design described in this disclosure as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What is claimed is:

1. A method, comprising:
   forming, via a first epitaxial growth of a first material, first pillars within first trenches formed within a dielectric layer, wherein the dielectric layer is formed on a silicon substrate, and wherein the first pillars comprise first portions with defects and second portions without the defects;
   forming second trenches within a first region of the dielectric layer;
   forming second pillars within the second trenches via a second epitaxial growth of one or more second materials using the second portions of the first pillars as seeds for the second epitaxial growth;
   removing the first pillars from the first trenches after the forming the second pillars; and
   filling the first trenches with a dielectric material, thereby isolating the second pillars from one another.

2. The method of claim 1, wherein the forming the first pillars comprises employing aspect ratio trapping to form the first portions with the defects and the second portions without the defects.

3. The method of claim 1, wherein the dielectric layer is also formed adjacent to the silicon substrate, and wherein the first material and the one or more second materials are characterized as lattice matched based on having same or similar lattice constants within a defined degree of similarity, and wherein the first material and the silicon substrate are characterized as lattice mismatched based on having different lattice constants that differ beyond the defined degree of similarity.

4. The method of claim 1, wherein the one or more second materials have a higher carrier mobility than silicon.

5. The method of claim 1, wherein the one or more second materials are selected from a group consisting of silicon germanium (SiGe), germanium (Ge), semiconductor III-V materials, and semiconductor II-VI materials.

6. The method of claim 1, wherein the one or more second materials comprise at least two different materials.

7. The method of claim 1, wherein the second pillars have a same height.

8. The method of claim 1, wherein the first trenches and the second trenches are orthogonal to one another.

9. The method of claim 1, wherein first portions of the first pillars are formed within a second region of the dielectric layer and wherein the second trenches extend within the first region of dielectric layer to a depth that ends at the second region of the dielectric layer.

* * * * *